United States Patent
Imaseki et al.

(10) Patent No.: US 7,321,169 B2
(45) Date of Patent: Jan. 22, 2008

(54) SEMICONDUCTOR DEVICE, MOUNTING STRUCTURE, ELECTRO-OPTICAL DEVICE, METHOD OF MANUFACTURING ELECTRO-OPTICAL DEVICE, AND ELECTRONIC APPARATUS

(75) Inventors: Ryosuke Imaseki, Nagano (JP); Ken Kaneko, Nagano (JP)

(73) Assignee: Seiko Epson Corporation (JP)

( * ) Notice: Subject to any disclaimer, the term of this patent is extended or adjusted under 35 U.S.C. 154(b) by 76 days.

(21) Appl. No.: 11/232,381

(22) Filed: Sep. 21, 2005

(65) Prior Publication Data

US 2006/0076638 A1   Apr. 13, 2006

(30) Foreign Application Priority Data

Sep. 29, 2004   (JP)   ............... 2004-283627

(51) Int. Cl.
  *H01L 23/48*   (2006.01)
  *H01L 23/52*   (2006.01)
  *H01L 29/40*   (2006.01)

(52) U.S. Cl. .................. 257/773; 257/692; 257/734; 438/666

(58) Field of Classification Search ................ 257/773, 257/433, 734, 696, 692; 438/618, 666
See application file for complete search history.

(56) References Cited

U.S. PATENT DOCUMENTS 6,897,568 B2   5/2005   Haimerl

FOREIGN PATENT DOCUMENTS

| JP | 03-185730 | * | 8/1991 |
|---|---|---|---|
| JP | 10-197557 | | 7/1998 |
| JP | 10-334458 | * | 12/1998 |
| JP | 2001-110831 | * | 4/2001 |
| JP | 2003-297654 | | 10/2003 |
| JP | 2004-509449 | | 3/2004 |
| JP | 2004-103860 | * | 4/2004 |
| JP | 2004-186333 | | 7/2004 |

OTHER PUBLICATIONS

Communication from Japanese Patent Office regarding counterpart application, Date: Dec. 8, 2006.

* cited by examiner

*Primary Examiner*—Jerome Jackson
*Assistant Examiner*—Anthony Ho
(74) *Attorney, Agent, or Firm*—Harness, Dickey & Pierce, P.L.C.

(57) ABSTRACT

A semiconductor device includes a protrusion group composed of a plurality of first protrusions arranged on a mounting surface with predetermined gaps; a plurality of second protrusions for burying spaces between the neighboring first protrusions; and conductive members provided on protruding surfaces of the plurality of first protrusions.

9 Claims, 11 Drawing Sheets

FIG. 14
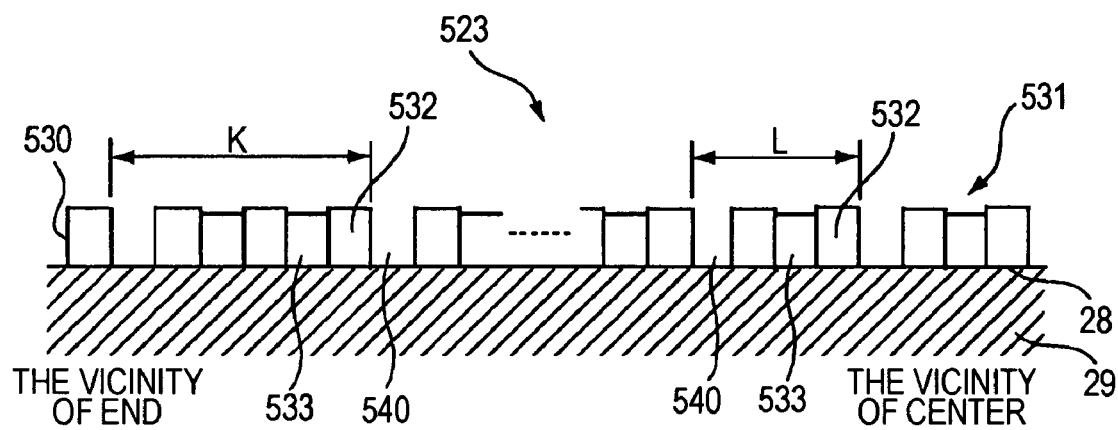
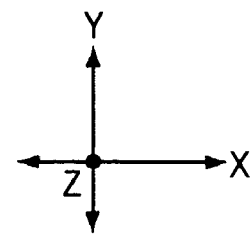

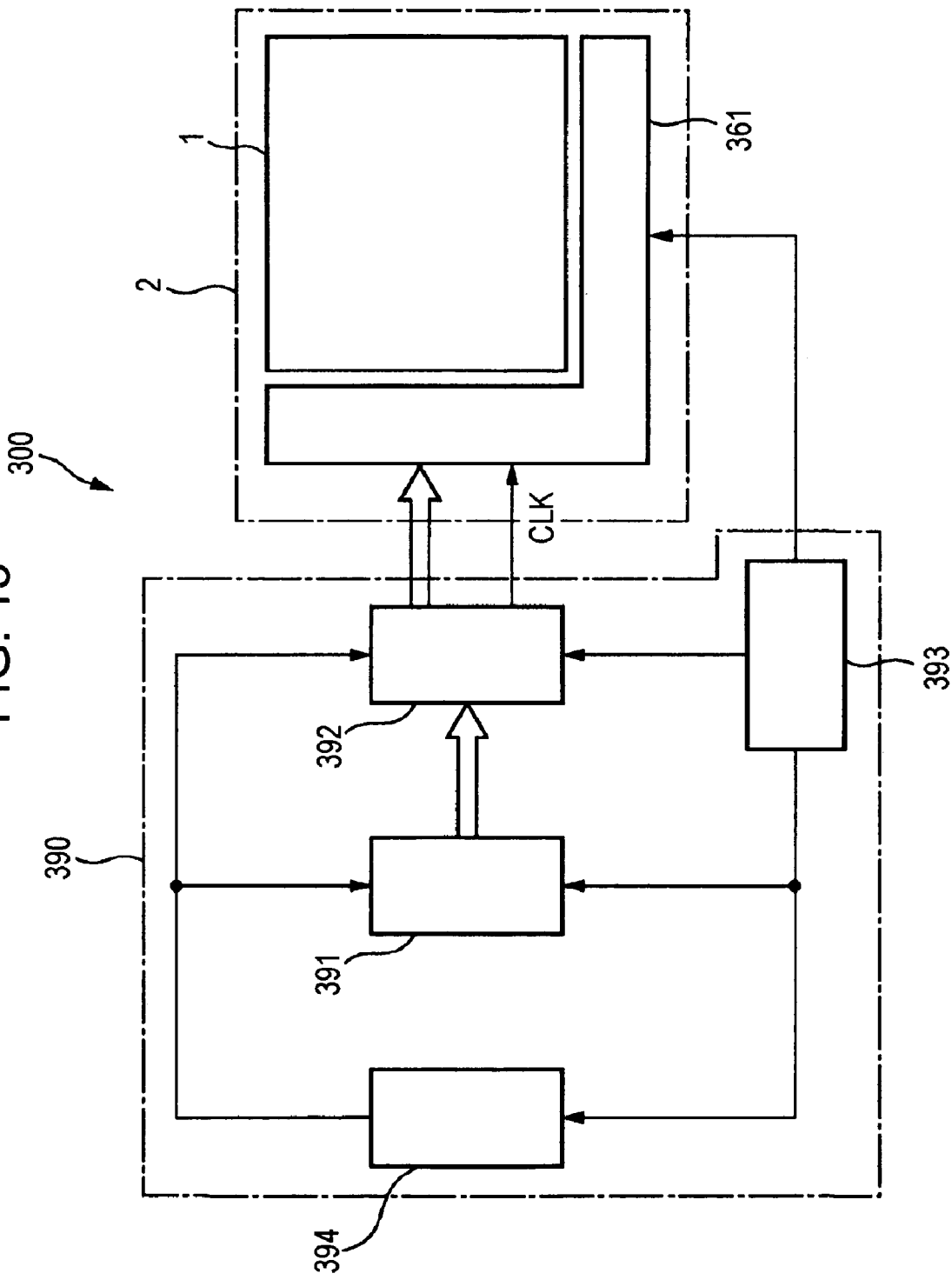

SEMICONDUCTOR DEVICE, MOUNTING STRUCTURE, ELECTRO-OPTICAL DEVICE, METHOD OF MANUFACTURING ELECTRO-OPTICAL DEVICE, AND ELECTRONIC APPARATUS

CROSS-REFERENCE TO RELATED APPLICATIONS

This application claims the benefit of Japanese Serial No. 2004-283627 filed Sep. 29, 2004. The disclosure of the above application is incorporated herein by reference.

BACKGROUND

1. Technical Field

The present invention relates to a semiconductor device used in a personal computer, a cell phone, or the like, to a mounting structure using the semiconductor device, to an electro-optical device using the semiconductor device, to a method of manufacturing the electro-optical device, and to an electronic apparatus using the electro-optical device.

2. Related Art

Generally, as display devices of electronic apparatuses, such as a personal computer or a cell phone, liquid crystal display devices are used. A semiconductor device such as a liquid crystal driving IC is mounted in the liquid crystal display device by a flip chip mounting method.

Meanwhile, recently, electronic apparatuses, such as personal computers and cell phones, are required to be small-sized while having a high performance. Therefore, it is required to decrease distances between wiring lines or terminals on a liquid crystal panel, that is, to make the pitch narrower. To cope with this, it is required to make the pitch of bumps of a semiconductor device narrower, that is, to make bumps of a semiconductor device have a high aspect ratio.

However, in the above-mentioned flip chip mounting method, in order to increase the height of bumps, a larger amount of metal needs to be used, the manufacturing process becomes complicated, and the manufacturing cost increases.

Accordingly, there has been proposed an external connecting protrusion which has at least a projecting body formed in the vicinity of an electrode of a semiconductor chip and a conductor continuously formed on the electrode and projecting body (for example, see JP-A-2001-110831 (paragraphs [0006] to [0028] and FIG. 5)). Also, there has been proposed a method of manufacturing a semiconductor device which includes a process of forming a resin layer in the semiconductor device, except for electrodes; a process of patterning conductive layers on the electrodes and the resin layer in accordance with a predetermined pattern of protrusions; and a process of removing the resin layer located between the conductive layers by using the patterned conductive layers as masks so as to form protrusions (for example, see JP-A-2004-186333 (paragraphs [0008] to [0013] and FIG. 4)).

According to the above-mentioned method, for example, the related art disclosed in JP-A-2001-110831, it is possible to improve the aspect ratio and to reduce the usage of metal as a material. However, for example, when the protrusion body is formed even between the neighboring conductors, since the projecting body bottlenecks an adhesive at the time of mounting the semiconductor device on a glass substrate, there is a possibility for the adhesive not to spread uniformly on a mounting surface. For this reason, bonding irregularity can occur, and the deformation amount of the projecting body can become different according to the location of the projecting body on the mounting surface of the semiconductor device, causing a defective connection between the conductor and a terminal of the glass substrate.

In addition, according to the related art disclosed in JP-A-2004-186333, it is possible to simplify the process of manufacturing the semiconductor device and to reduce the pitch. However, for example, if the resin layer is completely removed by using the conductive layers as masks, in a case of mounting the semiconductor device on a glass substrate of a liquid crystal display device, or the like, there is a possibility that the repulsive force of the projecting body will become weak, causing the mounting surface of the semiconductor device not to be fixed parallel to the glass substrate. Further, if the mounting surface of the semiconductor device is not fixed parallel to the glass substrate, there is a possibility that a defective connection between the conductors and the terminals of the glass substrate will occur according to the location of the mounting surface of the semiconductor device.

In addition, in the case of completely removing the resin layer by using the conductive layers as masks, there is a possibility that an adhesive will spread less uniformly on the mounting surface in the vicinities of both ends of a protrusion group composed of a plurality of protrusions in the longitudinal direction of the protrusion group than in the vicinity of the center of the protrusion group in the longitudinal direction. For this reason, bonding irregularity can occur, and the deformation amount of the protrusions can become different according to the location of the protrusions on the mounting surface of the semiconductor device, causing a defective connection between the conductor and a terminal of the glass substrate.

SUMMARY

An advantage of some aspects of the invention is that it provides a semiconductor device which can increase the reliability of the connection with a counter substrate at the time of being mounted on a glass substrate or the like and can reduce the manufacturing cost of an electro-optical device and the like, a mounting structure using the semiconductor device, an electro-optical device using the semiconductor device, a method of manufacturing the electro-optical device, and an electronic apparatus using the electro-optical device.

In order to achieve the above-mentioned advantage, according to a first aspect of the invention, a semiconductor device includes a protrusion group composed of a plurality of first protrusions arranged on a mounting surface with predetermined gaps; a plurality of second protrusions for burying spaces between the neighboring first protrusions; and conductive members provided on protruding surfaces of the plurality of first protrusions.

Here, 'the mounting surface' means a surface of the semiconductor device on the glass substrate side at the time of mounting the semiconductor device on the glass substrate.

According to the above-mentioned structure, since the second protrusions are provided between the neighboring first protrusions with the conductive member provided thereon, it is possible to cull (that is, to not provide) the second protrusions at predetermined intervals or to adjust the height of the second protrusions from the mounting surface. Therefore, it is possible to prevent unevenness of an adhesive at the time of mounting or to prevent that the repulsive force of the first and second protrusions becomes weak. As a result, the degree of the parallelization of the mounting can be secured.

Preferably, the second protrusions may be culled at predetermined intervals, and the culling interval in the vicinity of the center of the protrusion group in the longitudinal direction may be different from the culling interval in the vicinities of both ends of the protrusion group in the longitudinal direction.

Here, "culling" means a state in which one second protrusion is removed or is not formed. By the culling of the second protrusions, the flow path of the adhesive is secured while the repulsive force of the protrusions becomes weak, and thus the degree of the parallelization of the mounting cannot be secured. In this case, if the number the culling is reduced by increasing the culling interval more in the vicinities of both ends of the protrusion group than in the vicinity of the center of the protrusion group, it is possible to maintain the repulsive force by the second protrusions so as to secure the degree of the parallelization of the mounting and to improve the reliability of the connection between the semiconductor device and a counter substrate.

Further, if the number of the cullings is reduced by increasing the culling interval more in the vicinities of both ends of the protrusion group than in the vicinity of the center of the protrusion group, it is possible for the adhesive in the vicinities of both ends of the protrusion group to spread more uniformly on the mounting surface with respect to the vicinity of the center and it is possible to prevent the defective connection between the semiconductor device and the counter substrate due to the uneven bonding.

Preferably, in the above-mentioned structure, the culling interval in the vicinities of both ends may be larger than the culled interval in the vicinity of the center. Therefore, by reducing number of culled second protrusions and increasing the culling interval more in the vicinities of both ends of the protrusion group than in the vicinity of the center of the protrusion group, it is possible to maintain the repulsive force by the second protrusions so as to secure the degree of the parallelization of the mounting and to improve the reliability of the connection between the semiconductor device and the counter substrate.

Preferably, in the above-mentioned structure, the height of the second protrusions from the mounting surface may be smaller than the height of the first protrusions from the mounting surface. Therefore, it is possible to adjust the gap formed between the counter substrate and the second protrusions at the time of mounting and to secure the optimum flow amount of the adhesive. Further, as compared with a case of removing completely the second protrusions, it is possible to deform more properly the first protrusions at the time of mounting and to maintain stably the deformed state stably.

Preferably, in the above-mentioned structure, the height of the second protrusions from the mounting surface in the vicinity of the center of the protrusion group in the longitudinal direction may be different from the height of the second protrusions from the mounting surface in the vicinities of both ends of the protrusion group in the longitudinal direction. Therefore, by increasing the height of the second protrusions from the mounting surface more in the vicinities of both ends of the protrusion group than in the vicinity of the center of the protrusion group, the adhesive flows from the gap formed between the counter substrate and the second protrusions in the vicinities of both ends of the protrusion group until the first protrusions are deformed to some extent. However, when the first protrusions are deformed more, the gap between the counter substrate and the second protrusions in the vicinities of both ends of the protrusion group disappears, causing repulsive force to occur. Thus, the degree of the parallelization of the mounting can be secured. Further, even at this time, since a gap is formed between the counter substrate and the second protrusions in the vicinity of the center of the protrusion group, the adhesive can flow in the vicinity of the center until the first protrusions are finally deformed to a predetermined state. As a result, it is possible to prevent the unevenness of the adhesive from occurring at the middle part, and to prevent the pressing defective such as the difference between the deformation amounts of the first protrusions.

Preferably, the protrusion group may be composed of a plurality of lines of which the longitudinal directions are parallel to one another. Therefore, it is possible to effectively use the mounting surface, thereby reducing the size of the semiconductor device. Also, at this time, by arranging the second protrusions such that the second protrusions in one line deviate from the second protrusions in another line, the adhesive can spread more uniformly on the mounting surface, thereby further improving the connection between the semiconductor device and the counter substrate.

Preferably, the mounting surface has a substantially rectangular shape, and the protrusion group may be disposed along the four sides of the rectangular shape. Therefore, it is possible to effectively use the mounting surface, thereby reducing the size of the semiconductor device. Further, it is possible to easily provide external wiring lines electrically connected to the semiconductor device.

According to a second aspect of the invention, a mounting structure includes the above-mentioned semiconductor device.

The mounting structure has the semiconductor device which can prevent unevenness of an adhesive at the time of mounting or prevent that the repulsive force of the first and second protrusions becomes weak, thereby securing the degree of the parallelization of the mounting. Therefore, it is possible to increase the reliability of the connection between the semiconductor device and the counter substrate at the time of mounting the semiconductor device on a glass substrate or the like, and at the same time, it is possible to reduce the manufacturing cost of the mounting structure.

According to a third aspect of the invention, an electro-optical device includes the above-mentioned semiconductor device.

The electro-optical device has the semiconductor device which can prevent unevenness of an adhesive at the time of mounting or prevent that the repulsive force of the first and second protrusions becomes weak, capable of securing the degree of the parallelization of the mounting. Therefore, it is possible to increase the reliability of the connection between the semiconductor device and the counter substrate at the time of mounting the semiconductor device on a glass substrate or the like, and at the same time, it is possible to reduce the manufacturing cost of the electro-optical device.

According to a fourth aspect of the invention, a method of manufacturing an electro-optical device having a substrate capable of holding an electro-optical material and a semiconductor device mounted on the substrate includes: manufacturing the semiconductor device having a protrusion group composed of a plurality of first protrusions arranged on a mounting surface with predetermined gaps, a plurality of second protrusions for burying spaces between the neighboring first protrusions, and conductive members provided on protruding surfaces of the plurality of first protrusions; and mounting the semiconductor device on the substrate.

Since the semiconductor device having the second protrusions between the first protrusions with the conductive member provided thereon is manufactured and the semiconductor device is mounted on the substrate, an electro-optical device can be provided which can prevent unevenness of an adhesive at the time of mounting or prevent that the repulsive force of the first and second protrusions becomes weak, thereby securing the degree of the parallelization of the mounting.

Preferably, during the manufacturing of the semiconductor device, the second protrusions may be formed such that the tinning interval of the second protrusions in the vicinity of the center of the protrusion group in the longitudinal is smaller than the culled interval of the second protrusions in the vicinities of both ends of the protrusion group in the longitudinal direction. By culling the second protrusions, the flow path of the adhesive is secured while the repulsive force of the protrusions becomes weak, and thus the degree of the parallelization of the mounting cannot be secured. In this case, by reducing the number of culled second protrusions by increasing the culling interval more in the vicinities of both ends of the protrusion group than in the vicinity of the center of the protrusion group, it is possible to maintain the repulsive force by the second protrusions so as to secure the degree of the parallelization of the mounting while securing the flow of the adhesive and to improve the reliability of the connection between the semiconductor device and the counter substrate.

Furthermore, since the number of culled second protrusions is reduced by increasing the culled interval more in the vicinities of both ends of the protrusion group than in the vicinity of the center of the protrusion group, it is possible for the adhesive in the vicinities of both ends of the protrusion group to spread more uniformly on the mounting surface with respect to the vicinity of the center and it is possible to prevent the defective connection between the semiconductor device and the counter substrate due to the uneven bonding.

Preferably, during the manufacturing of the semiconductor device, the semiconductor device may be manufactured such that the height of the second protrusions from the mounting surface is smaller than the height of the first protrusions from the mounting surface. Therefore, it is possible to adjust the gap formed between the counter substrate and the second protrusions at the time of mounting and to secure the optimum flow amount of the adhesive. Further, as compared with a case of removing completely the second protrusions, it is possible to deform more properly the first protrusions at the time of mounting and to maintain stably the deformed state.

Preferably, during the manufacturing of the semiconductor device, the semiconductor device may be manufactured such that the height of the second protrusions from the mounting surface in the vicinities of both ends of the protrusion group in the longitudinal direction is larger than the height of the second protrusions from the mounting surface in the vicinity of the center of the protrusion group in the longitudinal direction of the protrusion group. Therefore, the adhesive flows from the gap formed between the counter substrate and the second protrusions in the vicinities of both ends of the protrusion group until the first protrusions are deformed to some extent. However, when the first protrusions are deformed sufficiently, the gap between the counter substrate and the second protrusions in the vicinities of both ends of the protrusion group disappears, causing repulsive force to occur. Thus, the degree of the parallelization of the mounting can be secured. Further, even at this time, since a gap is formed between the counter substrate and the second protrusions in the vicinity of the center of the protrusion group, the adhesive can flow in the vicinity of the center until the first protrusions are finally deformed to a predetermined state. As a result, it is possible to prevent the unevenness of the adhesive from occurring at the middle part, and to prevent the defective crimping such as the difference between the deformation amounts of the first protrusions.

Preferably, during the mounting the semiconductor device on the substrate, the semiconductor device may be mounted on the substrate by a non-conductive adhesive such that the conductive member of the semiconductor device is directly connected to the terminals provided on the substrate. Therefore, it is unnecessary to make the adhesive contain conductive particles like, for example, an ACF (anisotropic conductive film), thereby preventing the defective connection between conductive particles and terminals electrically connected thereto. In addition, since conductive particles are unnecessary, it is possible to reduce the manufacturing cost. Here, 'the non-conductive adhesive' includes NCP (non-conductive paste), NCF (non-conductive film), etc.

According to a fifth aspect of the invention, an electronic apparatus includes the above-mentioned electro-optical device.

In this way, since the electronic apparatus has the semiconductor device which can increase the reliability of the connection with a counter substrate at the time of being mounted on a glass substrate or the like and can reduce the manufacturing cost of an electro-optical device and so on, it is possible to increase easily the reliability of the performance of the electronic apparatus and to reduce the manufacturing cost of the electronic apparatus.

BRIEF DESCRIPTION OF THE DRAWINGS

The invention will be described with reference to the accompanying drawings, wherein like numbers reference like elements.

FIG. 14 is a side view schematically showing a protrusion group of a liquid crystal driving IC according to a third embodiment of the invention.

FIG. 15 is a block diagram schematically showing a display control system of an electronic apparatus according to a fourth embodiment of the invention.

DESCRIPTION OF EXEMPLARY EMBODIMENT

Hereinafter, the preferred embodiments of the invention will be described with reference to the accompanying drawings. For explaining some embodiments, as examples of an electro-optical device, a liquid crystal display device, in particular, an active-matrix-type liquid crystal display device using TFDs (thin film diodes) that are transflective two-terminal switching elements and an electronic apparatus using the liquid crystal display device will be described, but a passive-matrix-type or thin film transistor element active-matrix-type liquid crystal display device may be used. In order to make components easily understood in the respective drawings, the scales or the number of the components is different from that in the real structure.

First Embodiment

Figure 1:
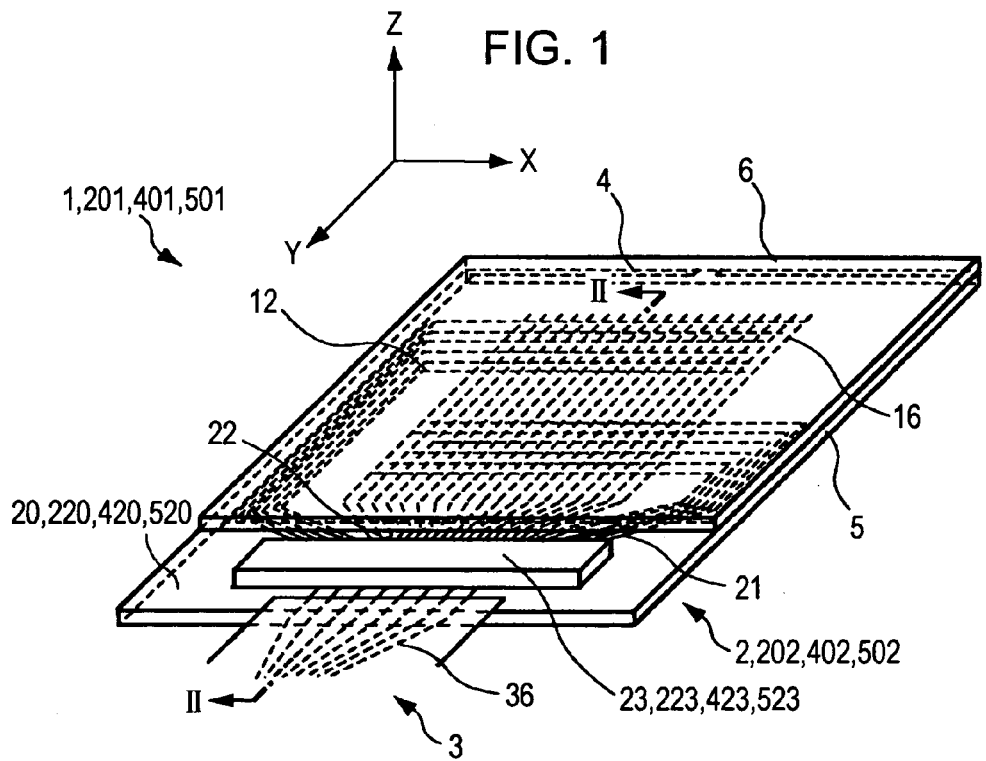
FIG. 1 is a perspective view schematically showing a liquid crystal display device according to a first embodiment.
Figure 2:
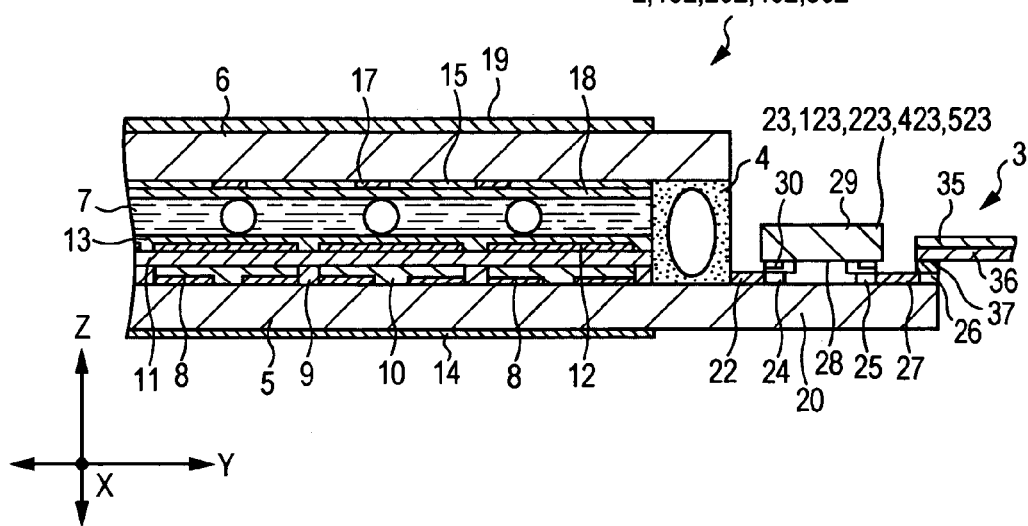
FIG. 2 is a partial cross-sectional view taken along the line II-II of FIG. 1 (a liquid crystal driving IC is not cut).
Figure 3:
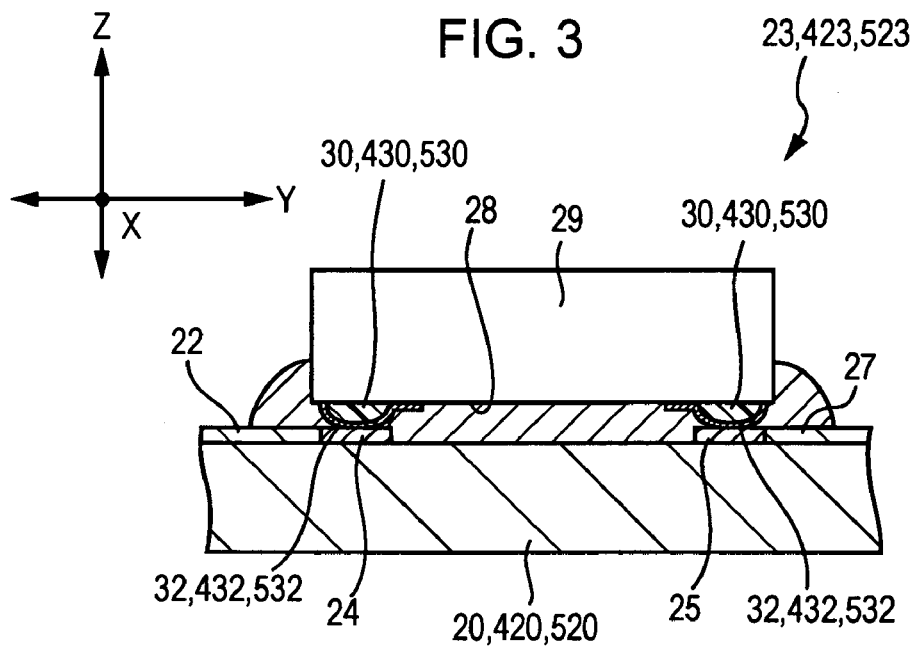
FIG. 3 is a diagram illustrating a mounting surface of the liquid crystal driving IC according to the first embodiment.
Figure 4:
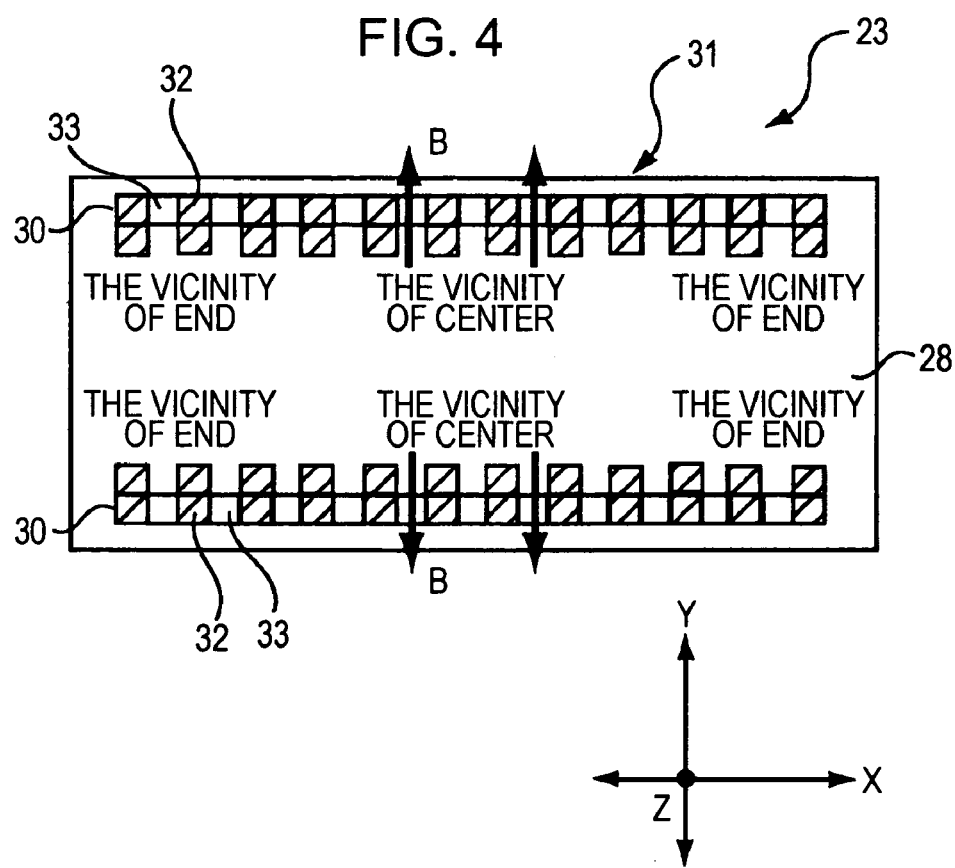
FIG. 4 is a plan view schematically showing a mounting surface of the liquid crystal driving IC according to the first embodiment.
Figure 5:
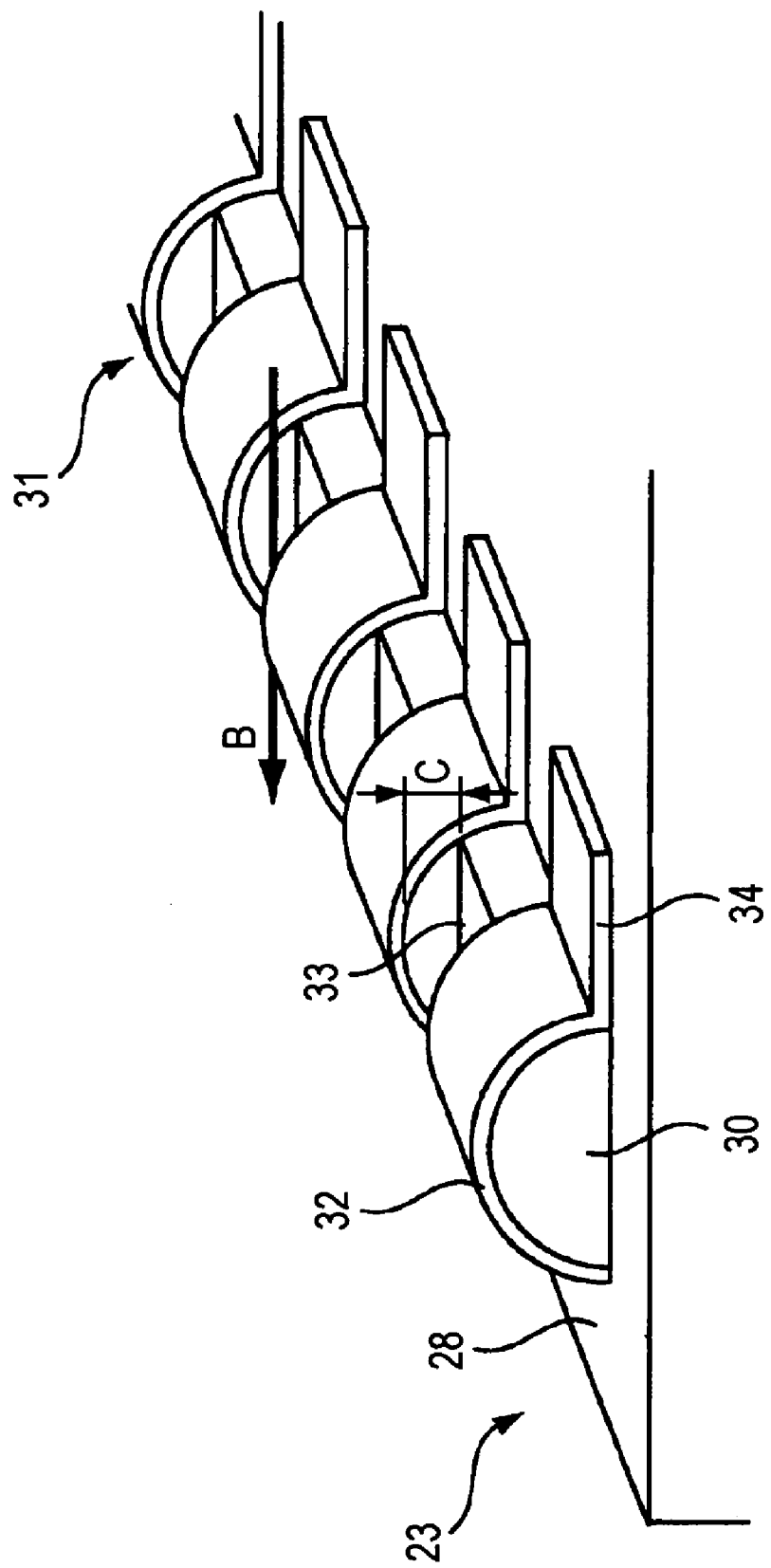
FIG. 5 is a partial perspective view schematically showing a protrusion group according to the first embodiment.

FIG. 1 is a perspective view schematically showing a liquid crystal display device according to a first embodiment of the invention, FIG. 2 is a partial cross-sectional view taken along the line II-II of FIG. 1 (a liquid crystal driving IC is not cut), FIG. 3 is a diagram illustrating a state in which the liquid crystal driving IC is mounted, FIG. 4 is a plan view schematically showing a mounting surface of the liquid crystal driving IC, and FIG. 5 is a partial perspective view schematically showing a protrusion group.

Structure of Liquid Crystal Display Device

A liquid crystal display device 1 has a liquid-crystal panel 2 of which a part is a mounting structure, as shown in FIG. 1, and a circuit substrate 3 connected to the liquid crystal panel 2. In the liquid crystal display device 1, in addition to the circuit board 3, an illuminating device such as a backlight or other ancillary mechanisms (not shown) can be additionally provided, if necessary.

As shown in FIGS. 1 and 2, the liquid crystal panel 2 has a pair of substrates which are a first substrate 5 and a second substrate 6 bonded by a sealant 4, and TN (Twist Nematic) liquid crystal 7 which is an electro-optical material sealed within a gap between the pair of substrates.

On a surface of the first substrate 5 on the liquid crystal side, a reflective film 8 having openings serving as a light transmitting region and a light shielding layer 9 are formed, as shown in FIG. 2. On the reflective film 8 having the openings (on the liquid crystal side), colored layers 10 are formed in regions separated by the light shielding layer 9.

On the colored layers 10 and the light shielding layer 9 on the liquid crystal side, an overcoat layer 11 is formed, and on the overcoat layer 11 on the liquid crystal side, scanning electrodes 12 are formed of a transparent conductive material such as ITO (indium tin oxide).

Further, on the scanning electrodes 12, an alignment film 13 is formed of, for example, polyimide resin. Furthermore, on the first substrate 5 on the side opposite to the liquid crystal, a polarizing plate 14 and the like is provided.

Meanwhile, for example, as shown in FIG. 2, on a surface of the second substrate 6 on the liquid crystal side, a plurality of pixel electrodes 15 arranged in a matrix, a plurality of signal electrodes 16 extending in strips in a direction crossing the above-mentioned scanning electrodes 12 in boundary regions of the pixel electrodes 15, and TFDs 17 electrically connected to the pixel electrodes 15 and the signal electrodes 16 are arranged, and on the TFDs on the liquid crystal side, an alignment film 18 is formed. Further, similarly to the first substrate 5, on the second substrate 6 on the side opposite to the liquid crystal, a polarizing plate 19 is provided.

Here, the first substrate 5 and the second substrate 6 are plate-shaped members formed of a light transmitting material, such as a glass or synthetic resin, for example, as shown in FIGS. 1 and 2, and the first substrate 5 has a protruding region 20 (hereinafter, referred to as 'a protruding portion') protruding out of the second substrate 6. The protruding portion 20 is one of the mounting structures of the liquid crystal display device 1 that is an electro-optical device.

Further, the scanning electrodes 12 are formed in strips extending in a predetermined direction (an X-axis direction in FIGS. 1 and 2) and the plurality of scanning electrodes 12 are arranged in a line forming a strip. The pixel electrodes 15 are formed of, for example, a transparent conductive material such as ITO.

Next, the protruding portion 20 has, as shown in FIGS. 1 to 3, scanning electrode wiring lines 21 and signal electrode wiring lines 22 that are electrode portions extending toward the protruding portion 20 from a region (hereinafter, referred to as 'a liquid crystal region') in which the scanning electrodes 12 and the signal electrodes 16 are surrounded by the sealant 4, and a liquid crystal driving IC 23 serving as a semiconductor device for supplying a liquid crystal driving current to the respective electrode wiring lines.

Further, the protruding portion 20 has a plurality of electrode terminals 24 provided in the mounting region on the first substrate corresponding to a mounting surface of the liquid crystal driving IC 23, and a plurality of input terminals 25 for applying a current from the circuit board 3 to the liquid crystal driving IC 23. The electrode terminals 24 are electrically connected to the scanning electrode wiring lines 21 and the signal electrode wiring lines 22.

Furthermore, the protruding portion 20 has an external terminal 26 for receiving a current from the circuit board 3, an input wiring line 27 for supplying a current from the external terminal to the input terminal 25, and so on. In addition, the signal electrode is formed of a metallic material such as Ta, Cr, or TaW.

Next, the liquid crystal driving IC 23 serving as a semiconductor device before being mounted will be described.

First, when the liquid crystal driving IC 23 receives various signals for display images or the like, for example, via the circuit board 3 and the input wiring line 27, it generates driving signals according to the received signals. The driving signals are supplied to the scanning electrode wiring lines 21 and the signal electrode wiring lines 22.

The liquid crystal driving IC 23 has, for example, a substantially rectangular shape such that the longer sides thereof are arranged in an X-axis direction, as shown in FIGS. 1 and 4. On a rear surface of a main body 29 which is a mounting surface 28 for the protruding portion 20, there are provided a protrusion group 31 composed of a plurality of first protrusions 30 which are separated from one another and are electrically connected to the plurality of electrode terminals 24 and the input terminals 25 formed on a surface of the protruding portion; connecting terminals 32 serving as conductive members provided on protruding surfaces of the first protrusions 30; and second protrusions 33 for burying gaps between the neighboring first protrusions 30.

Further, for example, as shown in FIG. 4, the first protrusions 30 are arranged in lines in the X-axis direction with a predetermined gap according to a pitch of each of counter terminals that are electrically connected to the upper longer side and the lower longer side in the drawing. At this time, the first protrusions 30 on the upper side become an output side, and the first protrusions 30 on the lower side become an input side.

Furthermore, the first protrusions 30 are formed of a material such as an acrylic resin or an epoxy resin so as to have a semicircular cross section, as shown in FIG. 5. For this reason, when the liquid crystal driving IC 23 is mounted on the protruding portion 20, the first protrusions 30 are pressed to slightly deform in a vertical direction so as to increase contact areas of vertexes of the connecting terminals 32 formed on the surfaces of the first protrusions. Therefore, it is possible to improve the electrical conductivity. Further, elastic force of the resin material makes it possible to achieve optimum connection in spite of the variation in the plurality of connecting terminals 32.

In addition, for example, as shown in FIG. 5, the connecting terminals 32 are formed substantially in strips so as to cover the protruding surfaces of the first protrusions 30 each having a semicircular cross section. An end of each connecting terminal extends partially on the mounting surface 28 so as to form a connector 34 electrically connected to an electrode pad (not shown).

Meanwhile, for example, as shown in FIG. 5, the second protrusions 33 are formed to have a height from the mounting surface 28 smaller than that of the first protrusions 30 by a value C so as to have a cross section obtained by removing the protruding portion of each first protrusion 30 by only the reduced height (the value C in FIG. 5). For example, each of the second protrusions has a cross section obtained by removing the upper half of the semicircular cross section.

Further, the second protrusions 33 are formed of the same material as the first protrusions 30. The second protrusions 33 may be formed by forming continuous elements having the same cross section as the first protrusions 30 and by etching the continuous elements up to forming locations of the second protrusions to remove about half of the continuous elements.

Therefore, when the liquid crystal driving IC 23 is mounted, an adhesive is flowed out from gaps due to the height difference, as shown by an arrow B in FIGS. 4 and 5, thereby removing unevenness of the adhesive. Further, the electrode pad is buried in the mounting surface 28 such that its surface is exposed, and is electrically connected to an internal circuit (not shown) of the liquid crystal driving IC 23.

Next, the first protrusions 30 of the liquid crystal driving IC 23 serving as a semiconductor device after being mounted slightly deform in a vertical direction such that their cross sections become a slightly flat semicircular shape, as shown in FIG. 3. Therefore, contact areas of the connecting terminals 32 covering the protrusions with electrode terminals 24 are enlarged.

Further, the liquid crystal driving IC 23 aligns with the protruding portion, and in order to adhere it, an adhesive such as NCF or NCP is coated to cover not only the mounting surface 28 but also a part of the side surfaces of the liquid crystal driving IC 23.

Next, the circuit board 3 is mounted on a base material 35 by forming a wiring pattern 36 and so on, for example, as shown in FIG. 2.

Here, the base material 35 is a film member having flexibility and the wiring pattern 36 is formed of, for example, copper. At an end of the wiring pattern on the protruding portion side, a terminal (not shown) is formed. The terminal is electrically connected to the external terminal 26 via an ACF (anisotropic conductive film) 37. Of course, electrical connection between the circuit board 3 and the liquid crystal panel 2 may use the first protrusions 30, the second protrusions 33, and the connecting terminals 32.

Method of Manufacturing Liquid Crystal Display Device

Next, a method of manufacturing a liquid crystal display device 1 constructed in this way will be described with focus on the mounting of a semiconductor device.

Figure 6:
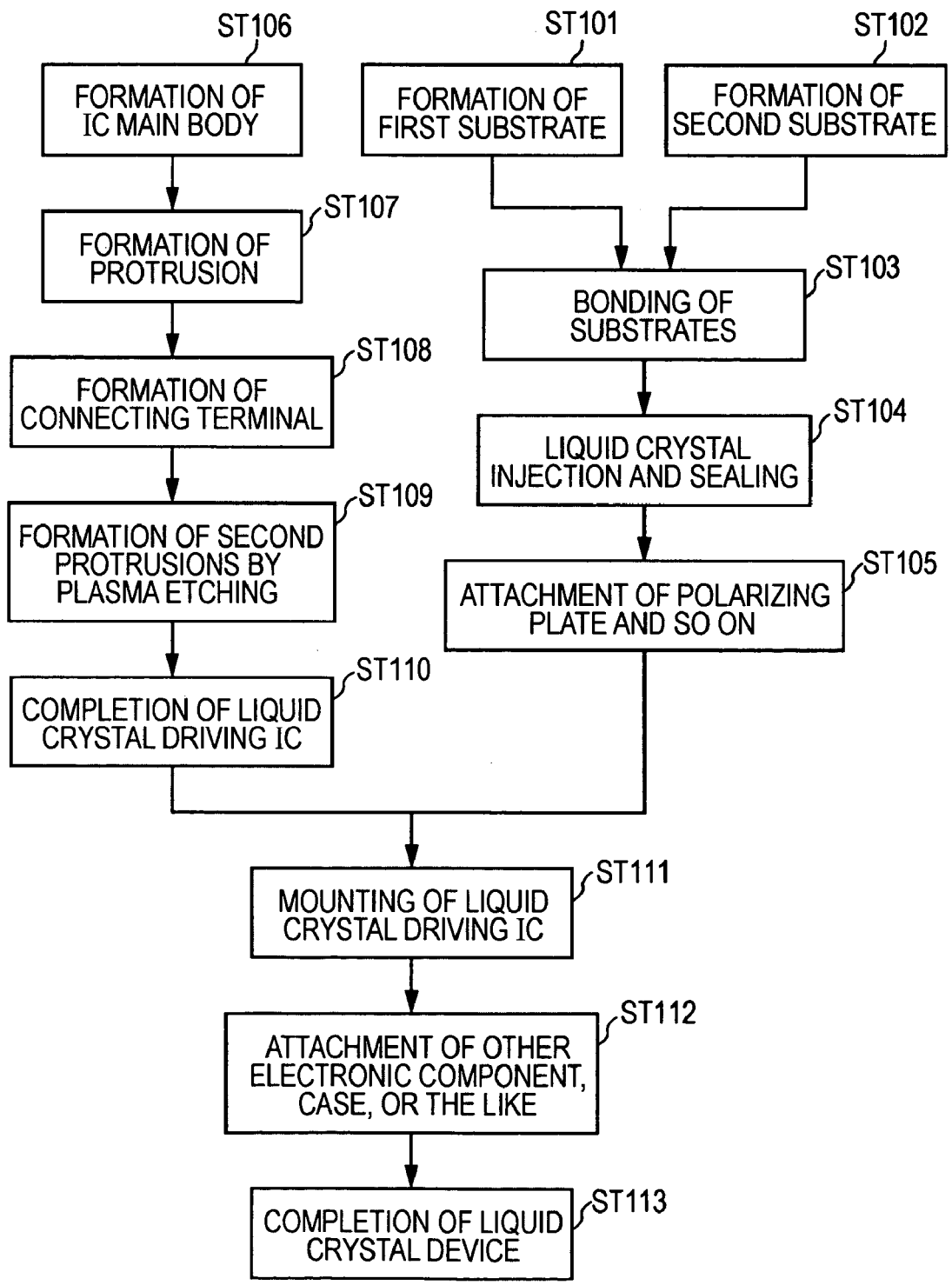
FIG. 6 is a flowchart illustrating a method of manufacturing a liquid crystal display device according to the first embodiment.

FIG. 6 is a flowchart of a method of manufacturing a liquid crystal display device according to the invention, and FIG. 7 is a partial cross-sectional view schematically illustrating the manufacturing process of the protrusion group.

First, a thin film is formed of, for example, aluminum on the first substrate 5 by an evaporation method, a sputtering method, etc. The thin film is patterned using a photolithographic method, such that openings are provided, for example, as shown in FIG. 2, and a reflective film 8 is formed around the openings.

Further, on the formed reflective film 8, a photosensitive resin in which a coloring material is dispersed is coated by a spin coating method or the like, and then patterning is performed thereon by the photolithographic method so as to form a light shielding layer 9 and a colored layer 10. Furthermore, on the light shielding layer 9 and the colored layer 10, an overcoat layer 11 is formed in the same way. On the overcoat layer 11, ITO (indium tin oxide) is deposited by the sputtering method and then is patterned by the photolithographic method, such that the scanning electrodes 12 are formed in stripes. After forming the scanning electrodes 12, the alignment film 13 is formed thereon and is subjected to a rubbing process. In this way, the manufacture of the first substrate side is completed (ST 101).

Furthermore, TFDs 17, the signal electrodes 16, and the pixel electrodes 15 are formed on the second substrate 6 by means of the sputtering method, the photolithographic method, etc. After that, the alignment film 18 is formed thereon, and is then subjected to a rubbing process. In this way, the manufacture of the second substrate side is completed (ST 102).

Subsequently, on the alignment film 18 on the second substrate side, a gap material (not shown) is sprayed by a dry spraying method and the first substrate 5 and the second substrate 6 is then bonded to each other using the sealant 4 (ST 103). Then, the liquid crystal 7 is injected from an inlet (not shown) of the sealant 4 and the inlet of the sealant 4 is sealed by a sealing material (not shown) such as an UV curable resin (ST 104). Furthermore, on the surfaces of the first and second substrates 5 and 6 at the outside, polarizing plates 14 and 19 and so on are attached, respectively (ST 105).

Next, as shown in FIG. 6, the manufacture of the liquid crystal driving IC 23 being a semiconductor device is performed.

First, according to the known method, a main body 29 of the liquid crystal driving IC 23 having an integrated circuit formed therein is formed (ST 106). At this time, the electrode pad electrically connected to the internal circuit is formed so as to be exposed to the mounting surface 28.

Figure 7A:
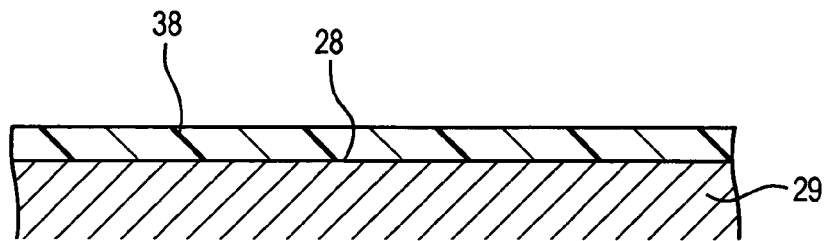
FIG. 7 is a partial cross-sectional view schematically illustrating the manufacturing process of the protrusion group.

Next, as shown in FIG. 7A, on the mounting surface 28 of the main body 29 for the first substrate 5, a resin layer 38 is formed of, for example, an acrylic resin or an epoxy resin, which is a material of the first and second protrusions 30 and 33. Then, the resin layer 38 is patterned such that the protrusion group 31 composed of the plurality of first protrusions 30 is formed to have a required length using the photolithography method and has a substantially semicircular cross-sectional shape, thereby forming protrusions 39 (ST 107). At this time, the patterning is performed such that the protrusions 39 can be formed near a plurality of electrode pads.

Figure 7B:
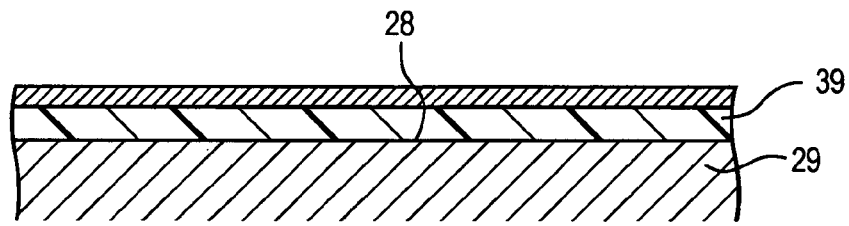
Figure 7C:
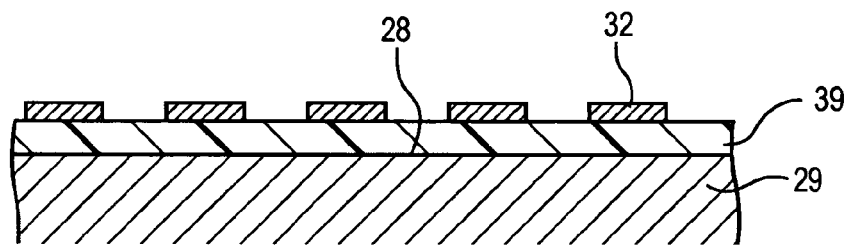

Further, as shown in FIG. 7B, on the mounting surface 28 including the patterned protrusions 39, a film is formed of a material of the connecting terminal 32 such as gold by the sputtering method or the like, and is patterned by the photolithographic method, whereby the plurality of connecting terminals 32 separated from one another with a predetermined gap are formed, as shown in FIGS. 5 and 7C (ST 108). At this time, the connectors 34, which are formed so as to extend on the mounting surface 28, as shown in FIG. 5, form the connecting terminals 32 such that the internal circuit of the liquid crystal driving IC 23 and the connecting terminals 32 are electrically connected via the electrode pads exposed to the mounting surface 28.

Figure 7D:
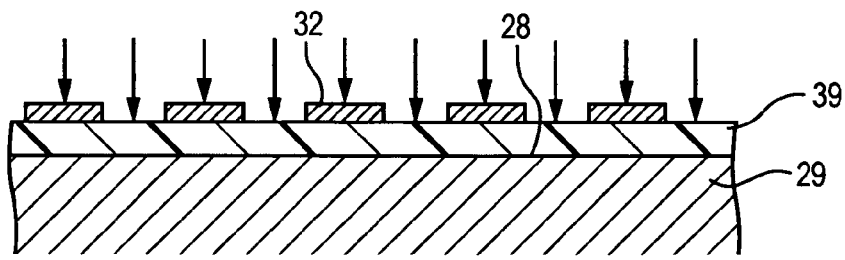
Figure 7E:
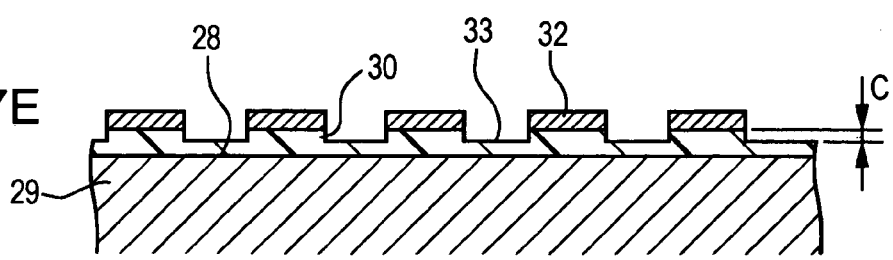

Then, for example, as shown in FIG. 7D, the formed connecting terminals 32 are used as masks, and the protrusions 39 not covered with gold or the like are partially removed by a plasma etching method such that the height of the protrusions from the mounting surface 28 becomes smaller by a value C than that before the plasma etching. In this way, as shown in FIGS. 5 and 7E, the first protrusions 30 covered with the connecting terminals 32 and the second protrusions 33 for burying the gaps between the neighboring first protrusions 30 are formed (ST 109). Therefore, since it is unnecessary to additionally prepare a mask for the formation of the second protrusions 33, it is possible to reduce the manufacturing cost. Further, since the boundaries between the first protrusions 30 and the second protrusions 33 are not sloped in a case of using the photolithographic method or the like, but substantially vertical surfaces as shown in FIG. 5, it is possible to make the pitch narrower.

With that, the liquid crystal driving IC 23 serving as a semiconductor device is completed (ST 110).

Next, for example, an NCF (non-conductive film) 40 is attached to the mounting region of the liquid crystal driving IC 23 of the protruding portion 20 so as to cover the electrode terminals 24, the input terminal 25, and so on.

Subsequently, on the NCF 40, the liquid crystal driving IC 23 is arranged such that the connecting terminals 32 are located to correspond to the electrode terminals or the like, and the liquid crystal driving IC 23 is pressed, and then is heated. Then, for example, as shown in FIG. 3, an adhesive, that is, the NCF 40 between the connecting terminals 32 and the electrode terminals 24 and between the connecting terminals 32 and the input terminal 25 is extruded. As a result, the connecting terminals 32 are brought directly into contact with the electrode terminals 24 and the input terminal 25.

If the liquid crystal driving IC 23 is further pressed, the first protrusions 30 are deformed so as to have the flat semicircular cross section, for example, as shown in FIG. 3.

Therefore, it is possible to make the contact areas with the electrode terminals 24 and the input terminal 25 larger and at the same time to achieve reliable connection by absorbing variation due to the height difference (ST 111).

Further, even when the first protrusions 30 are brought into contact with the electrode terminals 24 and the input terminal 25, since gaps exist between the second protrusions 33 and the surface of the protruding portion 20 opposing the second protrusions without contacting them, the adhesive of the fluidized NCF 40 can be flowed out as shown by an arrow B in FIGS. 4 and 5, and can spread sufficiently in the vicinity of the center in the longitudinal direction (the X-axis direction in FIG. 4) of the plurality of the first protrusions 30, which constitute the protrusion group shown, for example, in FIG. 4. Therefore, unlike the related art, when the liquid crystal driving IC 23 is mounted, since the adhesive spreads sufficiently uniform, the deformation amounts of the first protrusions depending on their locations are the same, thereby preventing the pressing defectives of the liquid crystal driving IC 23.

Further, by adjusting the height of the second protrusions 33, it is possible to secure the optimum gap and to properly prevent the pressing irregularity.

Next, on the circuit board 3, required electronic components are mounted, and terminals electrically connected to the wiring pattern 36 of the circuit board 3 are electrically connected to the external terminal 26 via the ACF 37, as shown in FIG. 2. Finally, other illuminating devices, cases, or the like are attached (ST 112). In this way, the liquid crystal display device 1 which is an electro-optical device is completed (ST 113).

The description of the manufacturing method of the liquid crystal display device is completed.

As such, according to this embodiment, since the semiconductor device such as the liquid crystal driving IC 23 is formed such that the height of the second protrusions 33 from the mounting surface 28 is smaller than that of the first protrusions 30 from the mounting surface 28, it is possible to adjust the gap to be formed between the counter substrate and the second protrusions 33 at the time of mounting the liquid crystal driving IC, and to secure the proper flow amount of the adhesive. Further, as compared with a case of completely removing the second protrusions 33, since the liquid crystal driving IC is supported by the second protrusions 33 provided on at least one side, it is possible to deform the first protrusions 30 more properly at the time of mounting the liquid crystal driving IC, and to stably maintain the mounted state.

Furthermore, since the liquid crystal driving IC 23 being a semiconductor device is mounted by using a non-conductive adhesive such as the NCF 40 such that the connecting terminals 32 are directly connected to the electrode terminals 24 and the input terminal 25, it is unnecessary to make the adhesive contain conductive particles as, for example, an ACF, thereby preventing the defective connection between conductive particles and terminals electrically connected thereto. In addition, since conductive particles are unnecessary, it is possible to reduce the manufacturing cost.

First Modification

Next, a first modification of the liquid crystal display device according to the invention will be described. The first modification is different from the first embodiment in that the protrusion group provided on the mounting surface is provided to four sides of a substantially rectangular mounting surface. Therefore, with focus on this point, the first modification will be described. Also, the same components as those in the first embodiment are denoted by the same reference numerals and the description thereof will be omitted.

Figure 8:
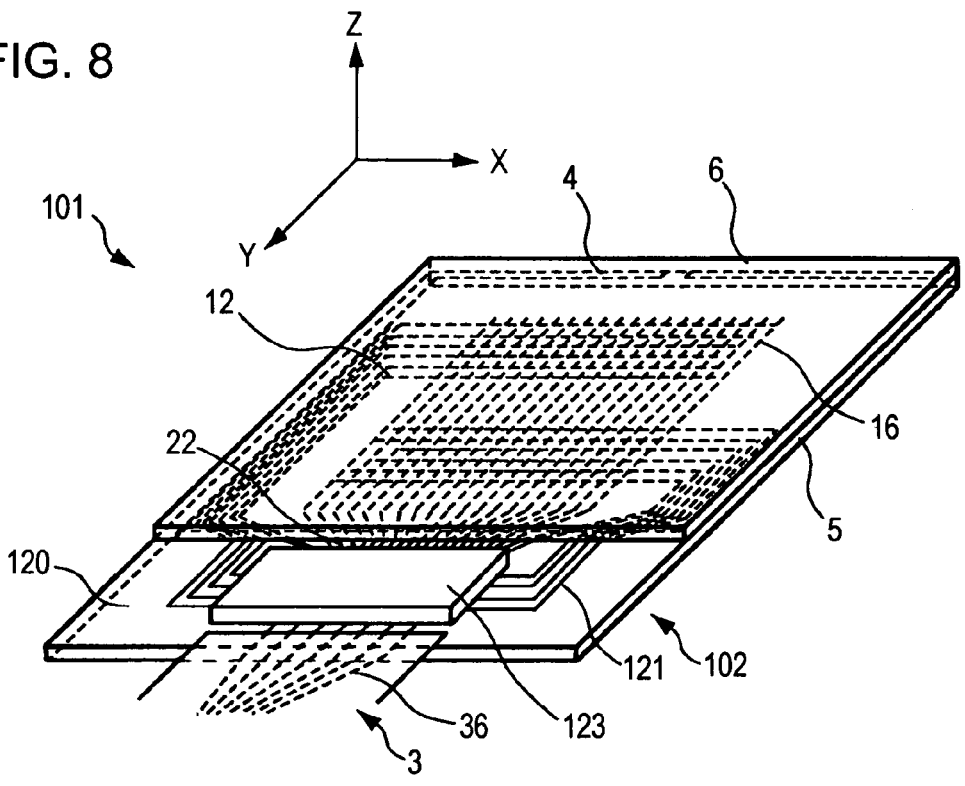
FIG. 8 is a perspective view schematically showing a liquid crystal display device according to a first modification.
Figure 9:
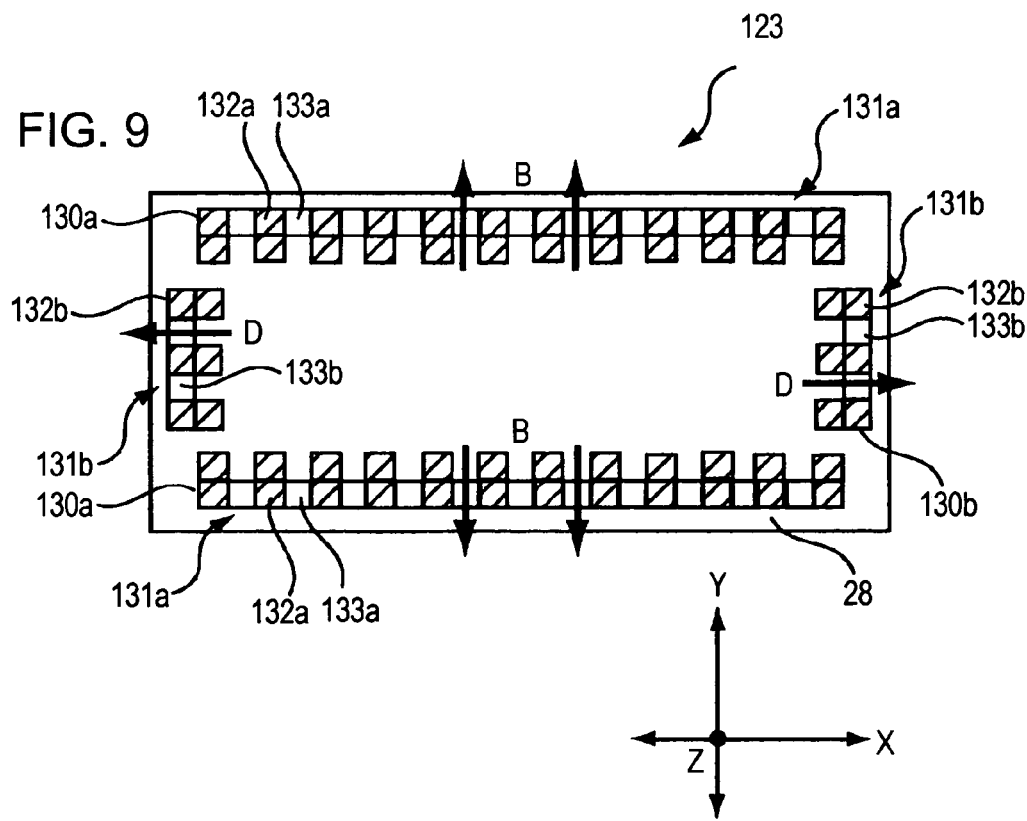
FIG. 9 is a plan view schematically showing a mounting surface of a liquid crystal driving IC according to the first modification.

FIG. 8 is a perspective view schematically showing a liquid crystal display device according to the first modification of the invention and FIG. 9 is a plan view schematically showing a mounting surface of a liquid crystal driving IC according to the first modification.

A liquid crystal display device 101 has a liquid crystal display panel 102 of which a part is a mounting structure, for example, as shown in FIG. 8, and a circuit board 3 connected to the liquid crystal panel 102. In the liquid crystal display device 101, in addition to the circuit board 3, an illuminating device such as a backlight or other ancillary mechanisms (not shown) can be additionally provided, if necessary.

Here, the first substrate 5 of the liquid crystal panel 102 has a protruding portion 120 protruding out of the second substrate 6 and the protruding portion 120 has, as shown in FIG. 8, scanning electrode wiring lines 121 and the signal electrode wiring lines 22 that are electrode portions extending to the protruding portion 120 from a region in which the scanning electrodes 12 and the signal electrodes 16 are surrounded by the sealant 4, and a liquid crystal driving IC 123 for supplying, for example, a liquid crystal driving current to the respective electrode wiring lines, etc. Further, as shown in FIG. 8, parts of the scanning electrode wiring lines 121 are output from the sides (the right and left sides in FIG. 8) of the liquid crystal driving IC 123.

Next, the liquid crystal driving IC 123 as a semiconductor device before being mounted will be described.

The liquid crystal driving IC 123 has, for example, a substantially rectangular shape so that the longer sides are arranged in an X-axis direction, as shown in FIGS. 8 to 9. On a rear surface of a main body 29 which is a mounting surface 28 to the protruding portion 120, there are provided protrusion groups 131a and 131b composed of a plurality of first protrusions 130a and 130b which are separated from one another and are electrically connected to the plurality of electrode terminals 24 and the input terminal 25 formed on a surface of the protruding portion, respectively; connecting terminals 132a and 132b serving as conductive members provided on protruding surfaces of the first protrusions 130a and 130b; and second protrusions 133a and 133b for burying gaps between the neighboring first protrusions 130a and 130b.

Further, the first protrusions 130a and 130b are arranged in lines along the four sides, for example, as shown in FIG. 9. The plurality of first protrusions 130a, which are arranged at the sides of the upper longer side and the lower longer side in two transverse lines (in the X-axis direction of FIG. 9) with a gap in FIG. 9, constitute the protrusion group 131a, and the plurality of first protrusions 130b, which are arranged at the sides of the right shorter side and the left shorter side in a vertical direction (in the Y-axis direction of FIG. 9) with a gap in FIG. 9, constitute the protrusion group 131b.

Furthermore, the first protrusions 130a and 130b are formed of a material such as an acrylic resin or an epoxy resin so as to have the cross section of a semicircular shape. For this reason, when the liquid crystal driving IC 123 is mounted on the protruding portion 120, the first protrusions 130a and 130b are pressed in a vertical direction so that they slightly deform, so as to increase contact areas of vertexes of the connecting terminals 132a and 132b formed on the surfaces of the first protrusions. Therefore, it is possible to improve the electrical conductivity. Further, elastic force of the resin material makes it possible to obtain optimum connection in spite of the variation in the plurality of connecting terminals 132a and 132b.

In addition, the connecting terminals 132a and 132b are formed substantially in strips so as to cover the protruding surfaces of the first protrusions 130a and 130b each having a semicircular cross section. An end of each connecting terminal extends partially on the mounting surface 28 so as to form a connector 34 electrically connected to an electrode pad (not shown).

Meanwhile, the second protrusions 133a and 133b are formed, for example, to have a height from the mounting surface 28 smaller than that of the first protrusions 130a and 130b by a value C so as to have a cross section obtained by removing the protruding portion of each of the first protrusions 130a and 130b by only the reduced height. For example, each of the second protrusions has a cross section obtained by removing the upper half of the semicircular cross section.

Further, the second protrusions 133a and 133b are formed of the same material as the first protrusions 130a and 130b. The second protrusions 133a and 133b may be formed by forming continuous elements having the same cross-sectional shape as the first protrusions 130a and 130b and by etching the continuous elements up to forming locations of the second protrusions so as to remove about half of the continuous elements.

As such, according to the first modification, the second protrusions 133a and 133b are formed with a smaller height than the first protrusions 130a and 130b, and the protrusion groups 131a and 131b are formed along the four sides of the mounting surface. Also, even though the protrusion groups are formed to surround the mounting surface, the adhesive of the NCF 40 can be flowed out from the gap between the second protrusions 133a and 133b and the surface of the protruding portion 120 as shown by arrows B and D in FIG. 9, and can spread uniformly on the mounting surface, thereby preventing the pressing defective of the liquid crystal driving IC.

Second Modification

Next, a second modification of the liquid crystal display device according to the invention will be described. The second modification is different from the first embodiment in that the protrusion groups provided on the mounting surface are provided in two lines along both the upper side and the lower side. Therefore, with focus on this point, the second modification will be described. Also, the same components as those in the first embodiment are denoted by the same reference numerals and the description thereof will be omitted.

Figure 10:
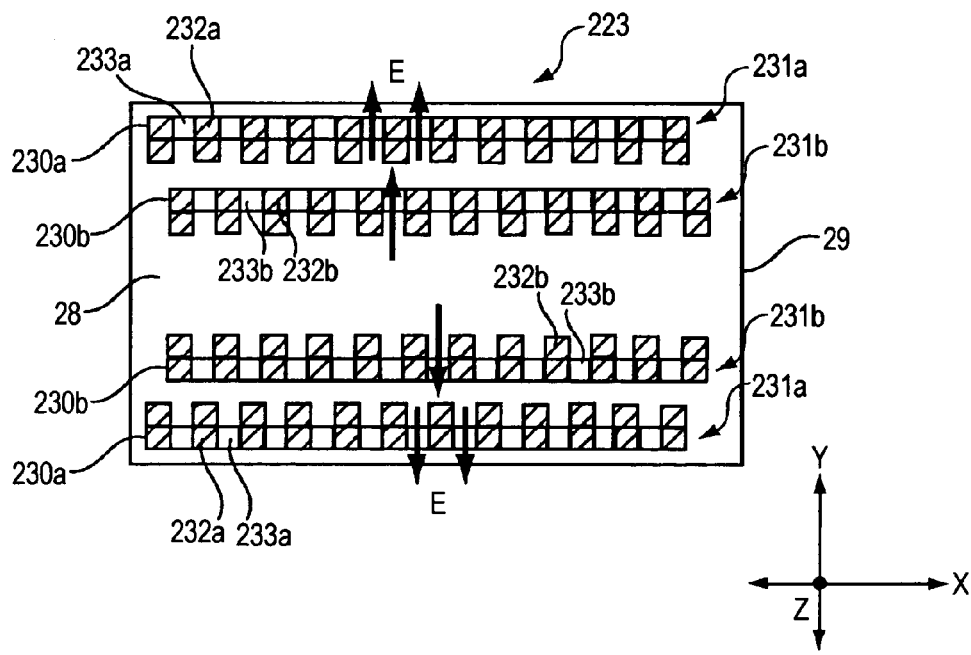
FIG. 10 is a plan view schematically showing a mounting surface of a liquid crystal driving IC according to a second modification.

FIG. 10 is a plan view schematically showing a mounting surface of a liquid crystal driving IC according to the second modification.

A liquid crystal display device 201 has a liquid crystal display panel 202 of which a part is a mounting structure, for example, as shown in FIG. 1, and a circuit board 3 connected to the liquid crystal panel 202. In the liquid crystal display device 201, in addition to the circuit board 3, an illuminating device such as a backlight or other ancillary mechanisms (not shown) can be additionally provided, if necessary.

Here, the first substrate 5 of the liquid crystal panel 202 has a protruding portion 220 protruding out of the second substrate 6 and the protruding portion 220 has a liquid crystal driving IC 223, etc.

Next, the liquid crystal driving IC 223 as a semiconductor device before being mounted will be described.

The liquid crystal driving IC 223 has, for example, a substantially rectangular shape so that the longer sides are arranged in an X-axis direction as shown in FIGS. 1 to 10. On a rear surface of a main body 29 which is a mounting surface 28 to the protruding portion 220, there are provided protrusion groups 231a and 231b composed of a plurality of first protrusions 230a and 230b which are separated from one another and are electrically connected to the plurality of electrode terminals 24 and the input terminal 25 formed on a surface of the protruding portion, respectively; connecting terminals 232a and 232b serving as conductive members provided on protruding surfaces of the first protrusions 230a and 230b; and second protrusions 233a and 233b for burying gaps between the neighboring first protrusions 230a and 230b.

Further, the first protrusions 230a and 230b are arranged along two sides of the liquid crystal driving IC 233 with the substantially rectangular shape, for example, as shown in FIG. 10. The plurality of first protrusions 230a and 230b, which are arranged along both the upper longer side and the lower longer side (in the X-axis direction of FIG. 10) in two transverse lines with a gap in FIG. 9, are formed with a predetermined gap according to a pitch of each counter terminal that is electrically connected to the upper longer side and the lower longer side in the drawing.

In particular, as shown in FIG. 10, the protrusions 231a and 231b are arranged in the two lines along the upper longer side of the mounting surface 28 having the substantially rectangular shape. In one line closer to the outside of the mounting surface 28 (the protrusion group 231a), there is provided the plurality of first protrusions 230a arranged with a predetermined gap, the connecting terminals 232a covering protruding surfaces of the first protrusions 230a; and the second protrusions 233a formed to bury the gaps between the first protrusions 230a and having the height from the mounting surface 28 smaller than that of the first protrusions 230a.

Further, in the other line closer to the inside of the mounting surface 28 (the protrusion group 231b), there is provided the plurality of protrusions 230b arranged with the predetermined gap, the connecting terminals 232b covering protruding surfaces of the first protrusions 230b; and the second protrusions 233b formed to bury the gaps between the neighboring first protrusions 230b and having the height from the mounting surface 28 smaller than that of the first protrusions 230b.

Here, in the other line closer to the inside of the mounting surface 28 (the protrusion group 231b), the first protrusions 230b, the connecting terminals 232b, and the second protrusions 233b are formed, for example, such that the second protrusions 233b are deviated by the width of one of the first protrusions 230b or the second protrusions 233 in the light or left direction with regard to the one line closer to the outside (the protrusion group 231a), as shown in FIG. 10.

Similarly, on the lower side of the mounting surface 28, for example, as shown in FIG. 10, the protrusions 231a and 231b are arranged in the two lines. In one line closer to the outside of the mounting surface 28 (the protrusion group 231a), there is provided the plurality of protrusions 230a, etc. In the other line closer to the inside of the mounting surface 28 (the protrusion group 231b), the first protrusions 230b, the connecting terminals 231b, and the second protrusions 233b are formed such that the second protrusions 233b are deviated by the width of one of the first protrusions 230b or the second protrusions 233 in the light or left direction with respect to the one line closer to the outside (the protrusion group 231a).

As such, according to the second modification, the protrusion groups are formed of the plurality of first protrusions arranged parallel to each other in the longitudinal direction. Therefore, by using the mounting surface 28 effectively, it is possible to reduce the size of the liquid crystal driving IC 223 being a semiconductor device. Further, at this time, by arranging the second protrusions 233a and 233b such that the second protrusions in one line deviate from the second protrusions in another line, the adhesive can spread more uniformly on the mounting surface, thereby improving further the connection between the semiconductor device and the counter substrate.

In particular, the two protrusion groups 231a and 231b are provided at both the upper side and the lower side of the mounting surface 28. Further, the second protrusions 233a and 233b, which are arranged in a transverse direction and have the height from the mounting surface 28 smaller than that of the first protrusions 230a and 230b, are formed, for example, to deviate from each other by the width of one second protrusion (233b) in the arrangement direction (the X-axis direction in FIG. 10). For this reason, the adhesive of the NCF 40 flows into the gap between the second protrusions and the counter substrate as shown by an arrow E in FIG. 10 so as to spread over the entire mounting surface without unevenness. Therefore, it is possible to achieve good pressing when the semiconductor device such as the liquid crystal driving IC 223 is mounted on the substrate.

Second Embodiment

Next, a liquid crystal display device according to a second embodiment of the invention will be described. The second embodiment is different from the first embodiment in that the height of the second protrusions in the vicinity of the center is different from the heights of the second protrusions in the vicinities of both ends. Therefore, with focus on this point, the second embodiment will be described. Also, the same components as those in the first embodiment are denoted by the same reference numerals and the description thereof will be omitted.

Figure 11:
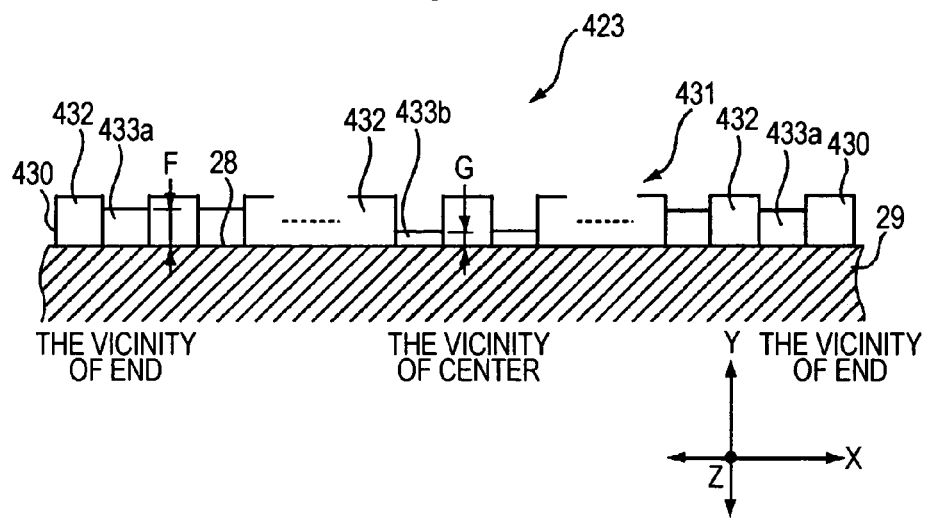
FIG. 11 is a side view schematically showing a protrusion group of a liquid crystal driving IC of the liquid crystal display device according to a second embodiment of the invention.
Figure 12:
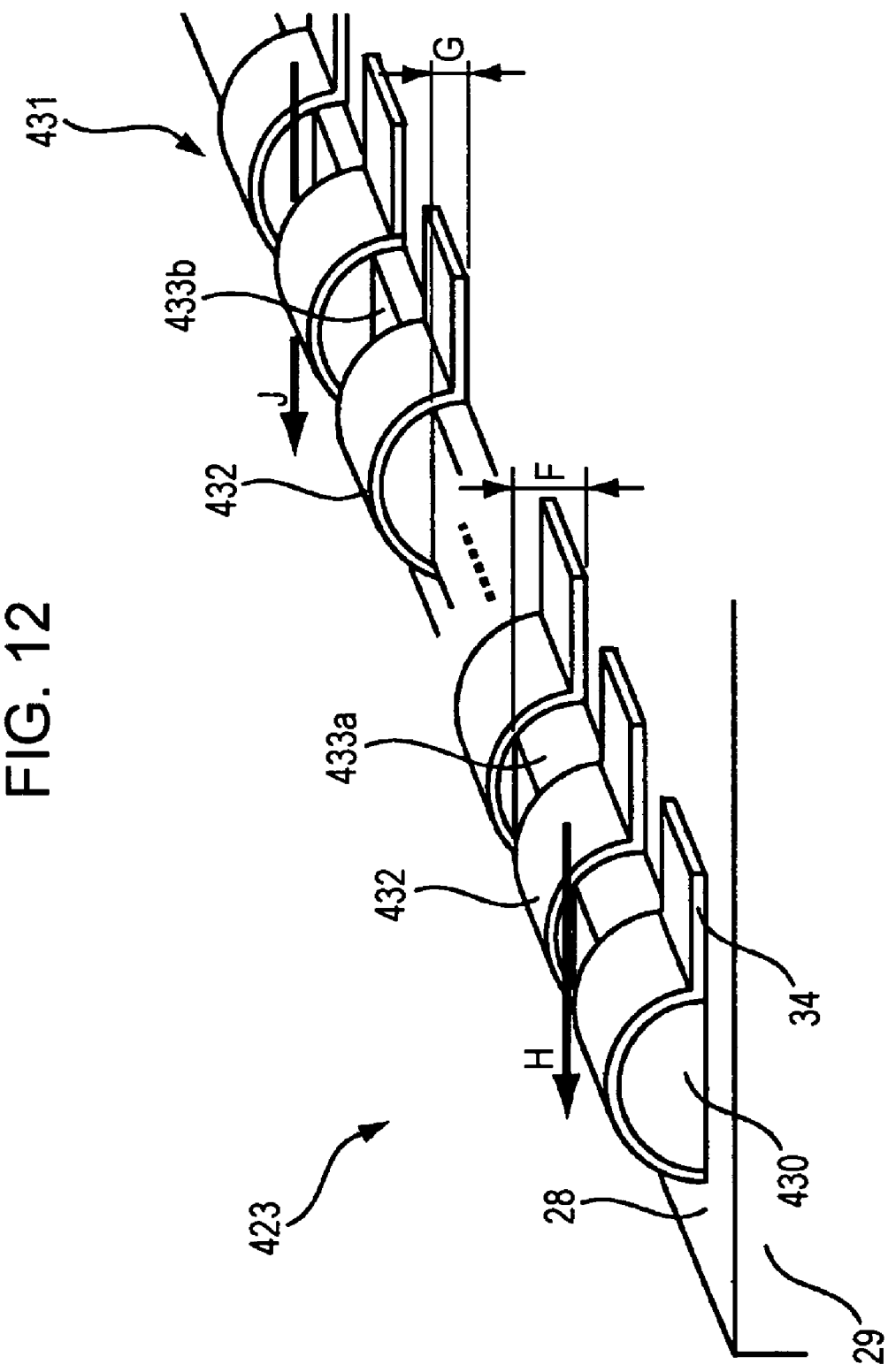
FIG. 12 is an enlarged perspective view schematically showing the protrusion group according to the second embodiment of the invention.

FIG. 11 is a side view schematically showing a protrusion group of a liquid crystal driving IC of the liquid crystal display device according to the second embodiment of the invention and FIG. 12 is an enlarged perspective view schematically showing the protrusion group of the liquid crystal driving IC.

Structure of Liquid Crystal Display Device

A liquid crystal display device 401 has a liquid crystal display panel 402 of which a part is a mounting structure, for example, as shown in FIG. 1, and a circuit board 3 connected to the liquid crystal panel 402. In the liquid crystal display device 401, in addition to the circuit board 3, an illuminating device such as a backlight or other ancillary mechanisms (not shown) can be additionally provided, if necessary.

Here, the first substrate 5 of the liquid crystal panel 402 has a protruding portion 420 protruding out of the second substrate 6 and the protruding portion 420 has a liquid crystal driving IC 423, etc.

Next, the liquid crystal driving IC 423 as a semiconductor device before being mounted will be described.

The liquid crystal driving IC 423 has, for example, a substantially rectangular shape of which the longer sides are arranged in an X-axis direction, as shown in FIGS. 1, 3, and 11. On a rear surface of a main body 29 which is a mounting surface 28 to the protruding portion 420, there are provided a protrusion group 431 composed of a plurality of first protrusions 430 which are separated from one another and are electrically connected to the plurality of electrode terminals 24 and the input terminals 25 formed on a surface of the protruding portion; connecting terminals 432 serving as conductive members provided on protruding surfaces of the first protrusions 430; and second protrusions 433a and 433b for burying gaps between the neighboring first protrusions 430.

Here, the second protrusions are formed such that the height of the second protrusions from the mounting surface 28 in the vicinity of the center in the longitudinal direction (the X-axis direction in FIG. 11) of the protrusion group 431 is different from the height of the second protrusions from the mounting surface 28 in the vicinities of both ends, as shown in FIG. 11. Further, the first protrusions 430 are arranged in a line in a transverse direction (the X-axis direction in FIG. 11) with a predetermined gap according to a pitch of each counter terminal that is electrically connected to the upper longer side and the lower longer side of the mounting surface 28 having a substantially rectangular shape. At this time, the first protrusions 430 on the upper side become an output side, and the first protrusions 430 on the lower side become an input side.

In particular, for example, as shown in FIG. 11, the second protrusions are formed such that the height F of the second protrusions 433a from the mounting surface 28 in the vicinities of both ends of the protrusion group 431 is larger than the height G of the second protrusion 433b from the mounting surface 28 in the vicinity of the center of the protrusion group (F>G). Further, the second protrusions 433a and 433b are formed to have the smaller height than the height of the first protrusions 430 from the mounting surface 28. For this reason, when the liquid crystal driving IC 423 is mounted on the protruding portion 420, for example, as shown in FIG. 12, the gap generated between the second protrusions 433a and the protruding portion 420 becomes narrower than the gap generated between the second protrusions 433b and the protruding portion 420. Further, the adhesive by the NCF 40 spreads on the entire mounting surface 28 as shown by arrows H and J in FIG. 12 without unevenness while securing the flow of the adhesive in the vicinity of the center. Therefore, it is possible to prevent the pressing irregularity at the time of pressing.

Method of Manufacturing Liquid Crystal Display Device

Next, a method of manufacturing the liquid crystal display device 401 according to this embodiment is the same as that of the first embodiment, except for the forming method of the second protrusions. Therefore, with focus on this point, the method will be briefly described.

Figure 13:
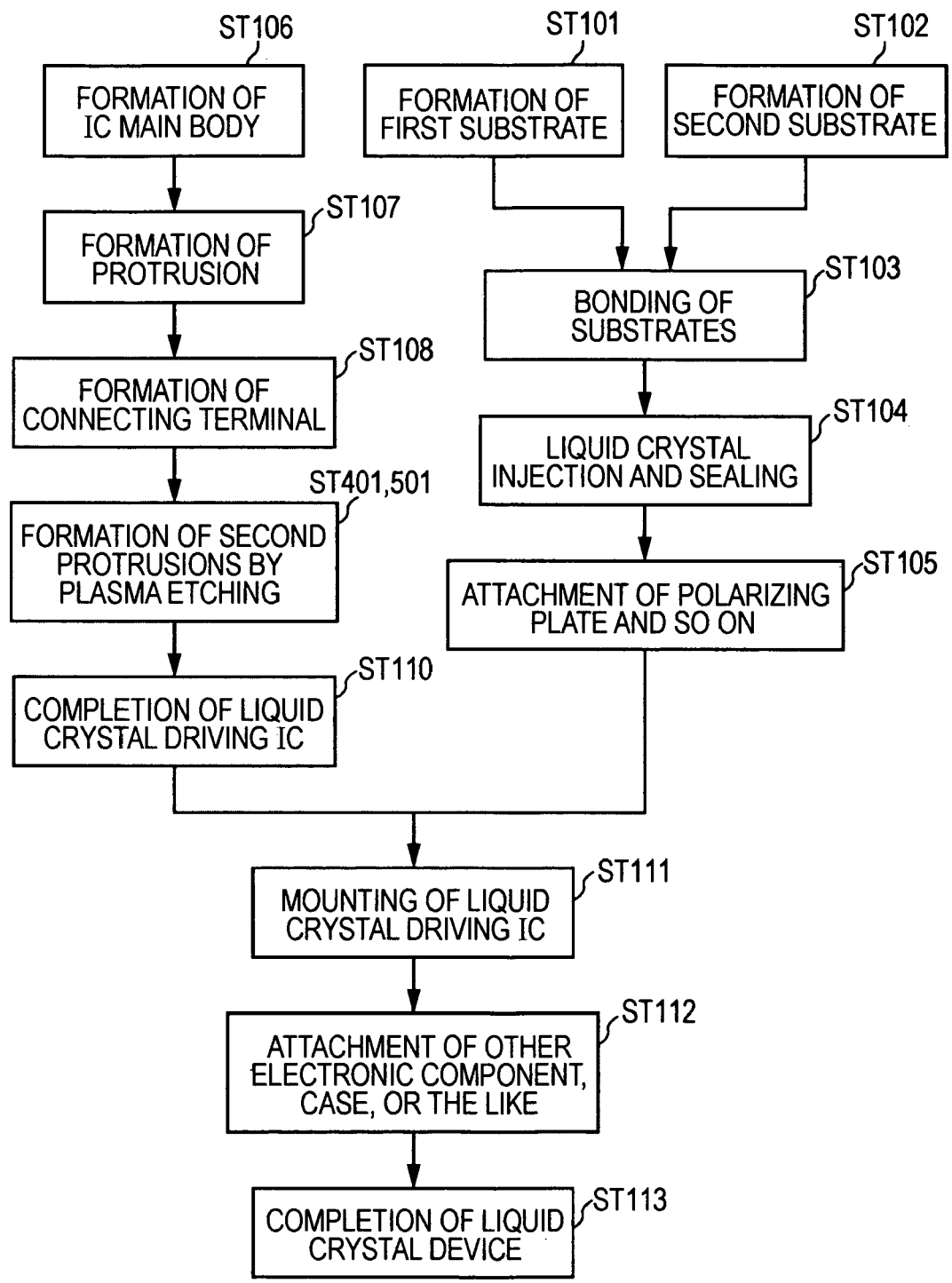
FIG. 13 is a flowchart illustrating a method of manufacturing a liquid crystal display device according to a second embodiment of the invention.

FIG. 13 is a flowchart illustrating the method of manufacturing the liquid crystal display device according to this embodiment.

Here, the processes from the formation of the first substrate side (ST 101) to the formation of the connecting terminals of the liquid crystal driving IC being a semiconductor device (ST 108) are the same as those in the manufacturing method of the first embodiment. Therefore, the description thereof will be omitted.

By ST 108 as shown in FIG. 13, after forming the plurality of connecting terminals 432 covering protruding surfaces of the first protrusions 430 and separated from one another with a predetermined gap as shown in FIG. 12, the second protrusions 433a and 433b of which the heights from the mounting surface 28 are different from each other are formed by the photolithographic method or the like so as to bury gaps between the neighboring first protrusions 430 (ST 401). For example, the second protrusions are formed by exposing or developing using multi-exposure or a halftone mask of which the transmitted light amount is different according to location, such that in the longitudinal direction (the X-axis direction in FIG. 11) of the protrusion group 431 in which the plurality of first protrusions and so on are arranged as shown in FIGS. 11 and 12, the height F of the second protrusions 433a from the mounting surface 28 in the vicinities of both ends is larger than the height G of the second protrusions 433b from the mounting surface 28 in the vicinity of the center of the protrusion group 431 (ST 401).

Hereinafter, the processes from ST 110 to ST 113 (the completion of the liquid crystal display device) are the same as those in the manufacturing method of the liquid crystal display device in the first embodiment. Therefore, the description thereof will be omitted.

With that, the description of the manufacturing method of the liquid crystal display device is completed.

As such, according to this embodiment, by making the height F of the second protrusions 433a from the mounting surface 28 in the vicinities of both ends of the protrusion group 431 larger than the height G of the second protrusions 433b from the mounting surface 28 in the vicinity of the center of the protrusion group 431 (F>G), as shown by an arrow H in FIG. 12, the adhesive flows even from the gap formed between the counter substrate and the second protrusions 433a in the vicinities of both ends of the protrusion group 431 until the first protrusions 430 are deformed to some extent by being pushed. However, when the first protrusions are deformed to some extent, the gap between the counter substrate and the second protrusions 433a in the vicinities of both ends of the protrusion group 431 disappears, causing repulsive force to occur. Thus, the degree of the parallelization of the mounting can be secured. Further, even at this time, since the gap is formed between the counter substrate and the second protrusions 433b in the vicinity of the center of the protrusion group 431, the adhesive can flow in the vicinity of the center as shown by the arrow J in FIG. 12 until the first protrusions 430 is finally deformed to a predetermined state. As a result, it is possible to prevent the unevenness of the adhesive from occurring at the middle part, and to prevent the pressing defectives such as the difference between the deformation amounts of the first protrusions 430.

Third Embodiment

Next, a liquid crystal display device according to a third embodiment of the invention will be described. The third embodiment is different from the first embodiment in that the height of the second protrusions is the same as that of the first protrusions but the second protrusions are culled (that is, are not provided or are removed) at predetermined intervals. Therefore, with focus on this point, the third embodiment will be described. Also, the same components as those in the first embodiment are denoted by the same reference numerals and the description thereof will be omitted. FIG. 14 is a side view schematically showing a protrusion group of a liquid crystal driving IC of the liquid crystal display device according to the third embodiment of the invention.

Structure of Liquid Crystal Display Device

A liquid crystal display device 501 has a liquid crystal display panel 502 of which a part is a mounting structure, for example, as shown in FIG. 1, and a circuit board 3 connected to the liquid crystal panel 502. In the liquid crystal display device 501, in addition to the circuit board 3, an illuminating device such as a backlight or other ancillary mechanisms (not shown) can be additionally provided, if necessary.

Here, the first substrate 5 of the liquid crystal panel 502 has a protruding portion 520 protruding out of the second substrate 6 and the protruding portion 520 has a liquid crystal driving IC 523, etc.

Next, the liquid crystal driving IC 523 as a semiconductor device before being mounted will be described.

The liquid crystal driving IC 523 has, for example, a substantially rectangular shape of which the longer sides are arranged in an X-axis direction, as shown in FIGS. 1, 3, and 14. On a rear surface of a main body 29 which is a mounting surface 28 to the protruding portion 520, there are provided a protrusion group 531 composed of a plurality of first protrusions 530 which are separated from one another and are electrically connected to the plurality of electrode terminals 24 and the input terminal 25 formed on a surface of the protruding portion; connecting terminals 532 serving as conductive members provided on protruding surfaces of the first protrusions 530; and second protrusions 533 for burying gaps between the neighboring first protrusions 530.

Further, for example, the first protrusions 530 are arranged in a line in a transverse direction (the X-axis direction in FIG. 14) with a predetermined gap according to a pitch of each counter terminal that is electrically connected to the upper longer side and the lower longer side of the mounting surface 28 having the substantially rectangular shape. At this time, the first protrusions 530 on the upper side become an output side, and the first protrusions 530 on the lower side become an input side.

Here, the second protrusions 533 are culled at the predetermined intervals, for example, as shown in FIG. 14, and are formed such that the culling interval in the vicinity of the center in the longitudinal direction (the X-axis direction in FIG. 14) of the protrusion group 531 is different from the culling interval in the vicinities of both ends in the longitudinal direction of the protrusion group. Said differently, the second protrusions 533 in the vicinity of the center of the protrusion group 531 in the longitudinal direction are disposed at a different density from the second protrusions 533 in the vicinity of ends of the protrusion group 531 in the longitudinal direction.

In particular, for example, as shown in FIG. 14, the second protrusions 533 are formed such that the culling interval K of the second protrusions 533 in the vicinities of both ends of the protrusion group 531 is larger than the culling interval L of the second protrusions 533 in the vicinity of the center of the protrusion group 531 (K>L). Said differently, the density of the second protrusions 533 in the vicinity of ends of the protrusion group 531 is greater than the density of the second protrusions 533 in the vicinity of the center of the protrusion group 531.

Method of Manufacturing Liquid Crystal Display Device

Next, a method of manufacturing the liquid crystal display device 501 according to the present embodiment is the same as that of the first embodiment, except for the forming method of the second protrusions. Therefore, with focus on this point, the method will be briefly described.

First, the processes from the formation of the first substrate side (ST 101) to the formation of the connecting terminals of the liquid crystal driving IC being a semiconductor device (ST 108) are the same as those in the manufacturing method of the first embodiment. Therefore, the description thereof will be omitted.

By ST 108 as shown in FIG. 13, after forming the plurality of connecting terminals 532 covering protruding surfaces of the first protrusions 530 and separated from one another with a predetermined gap, the second protrusions 533 having the culled portions 540 at the predetermined intervals are formed by the photolithographic method or the like so as to bury gaps between the neighboring first protrusions 530 (ST 501).

Hereinafter, the processes from ST 110 to ST 113 (the completion of the liquid crystal display device) are the same as those in the manufacturing method of the liquid crystal display device in the first embodiment. Therefore, the description thereof will be omitted.

With that, the description of the manufacturing method of the liquid crystal display device is completed.

As such, according to this embodiment, since the second protrusions 533 are culled at the predetermined intervals, it is possible to secure the flow path of the adhesive such as the NCF 40. Further, it is possible to prevent that when the liquid crystal driving IC 523 is mounted on a glass substrate or the like, the flow path is cut off by some protrusions. Therefore, the adhesive can spread uniformly on the mounting surface 28.

Further, if the repulsive force of the first protrusions 530 becomes weak by culling, the degree of the parallelization of the mounting cannot be secured. In this case, since the amount of culling is reduced by increasing the culling interval in the vicinities of both ends of the protrusion group 531 than in the vicinity of the center of the protrusion group, it is possible to maintain the repulsive force by the second protrusions 533 so as to secure the degree of the parallelization of the mounting and to improve the reliability of the connection between the liquid crystal driving IC 523 and the counter substrate.

Furthermore, since the number of the cullings is reduced by increasing the culling interval in the vicinities of both ends of the protrusion group 531 rather than in the vicinity of the center of the protrusion group, the adhesive spreads uniformly on a mounting surface not only in the vicinity of the center of the protrusion group 531 but also in the vicinities of both end of the protrusion group 531, thereby preventing the defective connection between the liquid crystal driving IC 523 and the counter substrate due to the uneven bonding.

Fourth Embodiment/Electronic Apparatus

Next, an electronic apparatus having one of the above-mentioned liquid crystal display devices 1, 101, 201, 401, and 501 in accordance with a fourth embodiment of the invention will be described. Also, the same components as those in the first embodiment are denoted by the same reference numerals and the description thereof will be omitted.

FIG. 15 is a block diagram schematically showing the entire structure of a display control system of an electronic apparatus according to the fourth embodiment of the invention.

As shown in FIG. 15, an electronic apparatus 300 has, for example, the liquid crystal panel 2, a display control circuit 390, and so on, and the display control circuit 390 has a display information output source 391, a display information processing circuit 392, a power supply circuit 393, a timing generator 394, etc.

Further, the liquid crystal panel 2 has a driving circuit 361 that drives a display region I.

The display information output source 391 has a memory composed of a ROM (Read Only Memory), a RAM(Random Access Memory), or the like; a storage unit composed of a magnetic recording disk, an optical recording disk, or the like; and a tuning circuit that tunes digital image signals and outputs the tuned signals. Further, the display information output source 391 is constructed to supply display information in the form of an image signal or the like having a predetermined format to the display information processing circuit 392 based on various clock signals generated by the timing generator 394.

The display information processing circuit 392 has various known circuits such as a serial-parallel converting circuit, an amplifying/inverting circuit, a rotation circuit, a gamma correction circuit, and a clamp circuit. The display information processing circuit 392 processes input display information to obtain image information and then supplies the image information to the driving circuit 361 together with clock signals CLK. Further, the power supply circuit 393 supplies predetermined voltages to the above-mentioned components.

As such, according to this embodiment, since the semiconductor device of the liquid crystal display device 1 used in the electronic apparatus 300, for example, the liquid crystal driving IC 23 is formed such that the height of the second protrusions 33 from the mounting surface 28 is smaller than the height of the first protrusions 30 from the mounting surface 28, it is possible to adjust the gap to be formed between the counter substrate and the second protrusions 33 at the time of mounting and to secure the optimum flow amount of the adhesive. Further, as compared with a case of completely removing the second protrusions 33, since the liquid crystal driving IC is supported by the second protrusions 33 provided to at least one surface, the first protrusions 30 are deformed more properly at the time of mounting the liquid crystal driving IC and the mounted state is stably maintained. Therefore, it is possible to provide the electronic apparatus 300 having high reliability of the electrical connection.

In particular, recent electronic apparatuses have been required to be low cost, high performance, and high quality. Therefore, this invention is characterized in that it provides an electronic apparatus having no pressing defective by mounting a semiconductor device on a substrate at low cost.

The electronic apparatuses according to the invention include a touch panel on which a liquid crystal display device is mounted, a projector, a liquid crystal television, a view-finder-type or monitor-direct-view-type video tape recorder, a car navigation apparatus, a pager, an electronic note, a calculator, a word processor, a work station, a video phone, a POS terminal, and so on, in addition to a cell phone or a personal computer. As display units of these various electronic apparatuses, the above-mentioned liquid crystal display devices 1, 101, 201, 401, and 501 can be applied.

Further, the electro-optical device and the electronic apparatus of the invention are not limited to the above-mentioned embodiments, and various changes or modifications can be made without departing from the spirit and scope of the invention. Furthermore, the above-mentioned embodiments and various changes or modifications can be combined without departing from the spirit and scope of the invention.

Although the foregoing description of the invention has been made on the preferable embodiments, the invention is not limited to the above-mentioned embodiments. The invention can be properly modified without departing from the spirit and scope of the invention.

For example, in the above-mentioned embodiments, the case in which the liquid crystal driving IC is used as the semiconductor device has been described. However, the semiconductor device is not limited thereto, and may be a semiconductor element used for mounting a bare chip. For example, in the field of an FPD (Flat Panel Display), there may be used the semiconductor device such a driving semiconductor or a power supply semiconductor, which is used to a PDP (Plasma Display Panel) or an OLED (Organic LED, Organic EL). Therefore, it is possible to prevent the pressing defectives at the time of the connection of various semiconductor devices.

Further, in the above-mentioned embodiments, the case in which the mounting structure is COG (Chip on Glass) has been described, but the mounting structure is not limited thereto. The invention can be applied to a case in which a semiconductor device is mounted on a circuit board, as in a case of COF (Chip on Film). Therefore, it is possible to prevent the pressing defectives at the time of the connection of various semiconductor devices.

Furthermore, in the above-mentioned embodiments, the case in which the first protrusions are formed at both ends of the protrusion group has been described, but the invention is not limited thereto. For example, the second protrusions may be formed at both ends of the protrusion group. Therefore, it is possible to improve the connection between the semiconductor device and the substrate by stably deforming the first protrusions.

What is claimed is:

1. A semiconductor device comprising:
   a protrusion group composed of a resin material and including a plurality of first protrusions arranged on a mounting surface and separated from each other, and a plurality of second protrusions composed of a resin material and located between certain adjacent first protrusions of the plurality of first protrusions; and
   conductive members provided on protruding surfaces of the plurality of first protrusions,
   wherein the height of the second protrusions from the mounting surface is smaller than the height of the first protrusions from the mounting surface;
   wherein certain others of adjacent first protrusions are separated by culling gaps where no second protrusions are provided, at a culling interval that is greater in the vicinity of ends of the protrusion group than in the vicinity of a center of the protrusion group.

2. The semiconductor device according to claim 1, wherein the protrusion group is composed of a plurality of lines whose longitudinal directions are parallel to one another.

3. The semiconductor device according to claim 1, wherein the mounting surface has a substantially rectangular shape, and the protrusion group is disposed along four sides of the rectangular shape.

4. A mounting structure comprising the semiconductor device according to claim 1.

5. An electro-optical device comprising the semiconductor device according to claim 1.

6. An electronic apparatus comprising the electro-optical device according to claim 5.

7. A method of manufacturing an electro-optical device having a substrate capable of holding an electro-optical material and a semiconductor device mounted on the substrate, the method comprising:
   manufacturing the semiconductor device; and
   mounting the semiconductor device on the substrate,
   wherein the semiconductor device has a protrusion group composed of a resin material and including a plurality of first protrusions arranged on a mounting surface and separated from each other, and a plurality of second protrusions composed of a resin material and located between certain adjacent first protrusions of the plurality of first protrusions; and conductive members provided on protruding surfaces of the plurality of first protrusions, wherein the height of the second protrusions from the mounting surface is smaller than the height of the first protrusions from the mounting surface, and wherein certain others of adjacent first protrusions being separated by culling gaps where no second protrusions are provided, at a culling interval that is greater in the vicinity of ends of the protrusion group than in the vicinity of a center of the protrusion group.

8. The method of manufacturing an electro-optical device according to claim 7, wherein during the mounting of the semiconductor device on the substrate, the semiconductor device is mounted on the substrate by means of a non-conductive adhesive such that the conductive members are directly connected to the terminals provided on the substrate.

9. An integrated chip comprising:

a protrusion group composed of a resin material and that includes a plurality of first protrusions arranged on a mounting surface and separated from each other;

a plurality of second protrusions composed of a resin material and located between adjacent first protrusions of the plurality of first protrusions; and conductive members provided on protruding surfaces of the plurality of first protrusions, wherein the height of the second protrusions from the mounting surface is smaller than the height of the first protrusions from the mounting surface, and wherein the height of the second protrusions in the vicinity of ends of the protrusions group is larger than the height of the second protrusions in the vicinity of center of the protrusion group.

* * * * *